(12) United States Patent
Kewitsch et al.

(10) Patent No.: US 6,387,593 B1
(45) Date of Patent: May 14, 2002

(54) SELF-TRAPPING AND SELF-FOCUSING OF OPTICAL BEAMS IN PHOTOPOLYMERS

(75) Inventors: Anthony S. Kewitsch, Hacienda Heights; Amnon Yariv, San Marino, both of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/443,035

(22) Filed: Nov. 18, 1999

Related U.S. Application Data

(62) Division of application No. 08/981,181, filed on Jul. 16, 1998, now Pat. No. 6,274,288.
(60) Provisional application No. 60/000,154, filed on Jun. 12, 1995, and provisional application No. 60/007,876, filed on Dec. 1, 1995.

(30) Foreign Application Priority Data

Jun. 11, 1996 (WO) ............................... PCT/US96/10151

(51) Int. Cl.[7] ................................................. G03C 5/00
(52) U.S. Cl. ..................................... 430/290; 430/396
(58) Field of Search ............................... 430/290, 321, 430/396

(56) References Cited

U.S. PATENT DOCUMENTS 4,666,236 A * 5/1987 Mikami et al. .......... 350/96.15
5,642,449 A * 6/1997 Phillips ....................... 385/33
6,081,632 A * 6/2000 Yoshimina et al. ............ 385/5

OTHER PUBLICATIONS

Segev et al, "Spatial Solitons in Photorefractive Media", *Physical Review Letters*, vol. 68, No. 7, p. 923–926, Feb. 17, 1992.

Duree et al, "Observation of Self-Trapping of an Optical Beam Due to the Photorefractive Effect", *Physical Review Letter*, vol. 71, No. 4, p. 533–536, Jul. 26, 1993.

Babu et al, "Calculation of image profiles for contrast enhanced lithography", *Journal of Vacuum Science & Technology B*, vol. 6, No. 2, p. 564–568, Mar./Apr. 1988.

Babu et al, "Optical Microlithography: Some Analytical Results", *Journal of Imaging Science*, vol. 33, No. 6, p. 193–199, Nov./Dec. 1989.

(List continued on next page.)

*Primary Examiner*—John A. McPherson
(74) *Attorney, Agent, or Firm*—Fish & Richardson P.C.

(57) ABSTRACT

A polymer material is exposed to radiation of a type that changes some aspect of the polymer's radiation passing properties. The radiation that caused the property change is then contained by the material. The property change can be self-focusing or self-trapping light can be used. In that case, the same light that causes the photopolymerization is contained by the change in index of refraction that is caused by the polymerization.

13 Claims, 19 Drawing Sheets

OTHER PUBLICATIONS

Davari et al, "A High–Performance 0.25–µm CMOS Technology: II–Technology", *IEEE Transactions on Electron Devices*, vol. 39, p. 967–975, No. 4, Apr. 1992.

Endo et al, "New portable conformable masking excimer laser lithography using water–soluble contrast enhanced material", *Journal of Vacuum Science & Technology B*, vol. 6, No. 1, p. 87–90, Jan./Feb. 1988.

Griffing et al, "Contrast Enhanced Lithography", *Solid State Technology*, p. 152–157, May 1985.

Hirai et al, "Study of half–micron photolithography by means of contrast enhanced lithography process", *Journal of Vacuum Science & Technology B*, vol. 5, No. 1, p. 434–438, Jan./Feb. 1987.

Hofer et al, "Characterization of the induction effect at mid–ultraviolet exposure: application to AZ2400 at 313 nm", *Optical Microlithography—Technology for the Mid–1980s*, vol. 334, 196–205, Mar. 31–Apr. 1, 1982.

Kaifu et al, Application of diazonaphothoquinone compounds and a diazonium salt to contrast enhanced lithography, *Journal of Vacuum Science & Technology B*, vol. 5, No. 1, p. 439–442, Jan./Feb. 1987.

Loong et al, "A direct approach to the modeling of polydihexylsilane as a contrast enhancement material", *Journal of Vacuum Science & Technology B*, vol. 8, No. 6, p.1731–1734, Nov./Dec. 1990.

Ochiai et al, "Design of high–resolution positive–working photoresist", *Journal of Photochemistry and Photobiology—A: Chemistry*, vol. 65, p. 277–284, 1992.

Tomo et al, "A New Contrast Enhanced Lithography (CEL) Process Using 'Chinese Rosin' as a Binder", *Polymer Engineering and Science*, vol. 29, No. 14, p. 902–906, Jul. 1989.

* cited by examiner

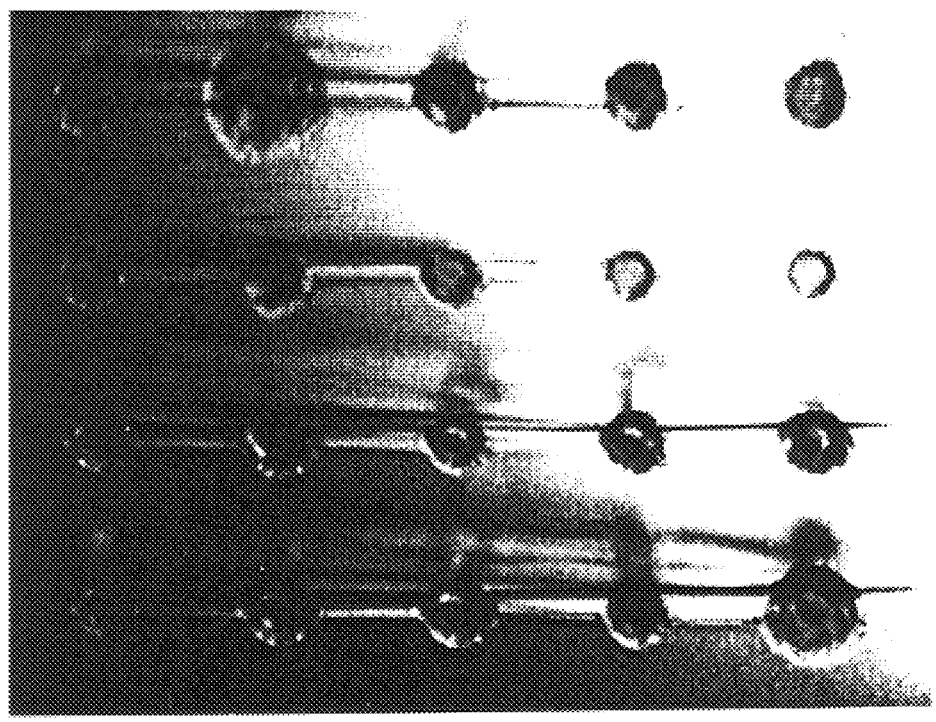
FIG. 4
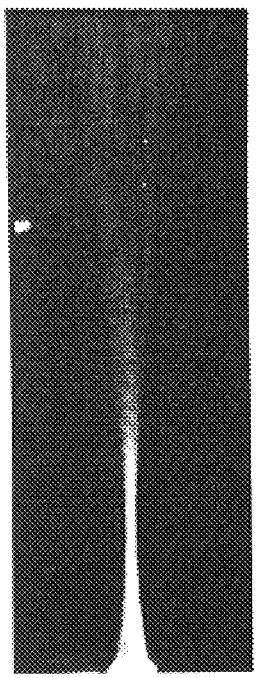 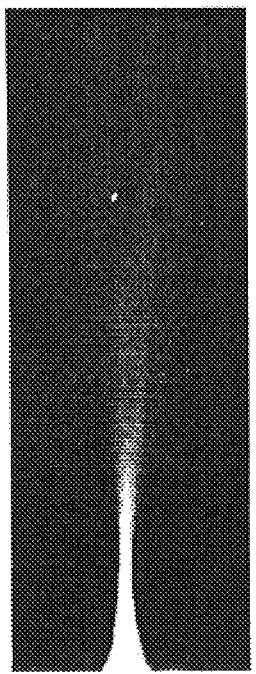 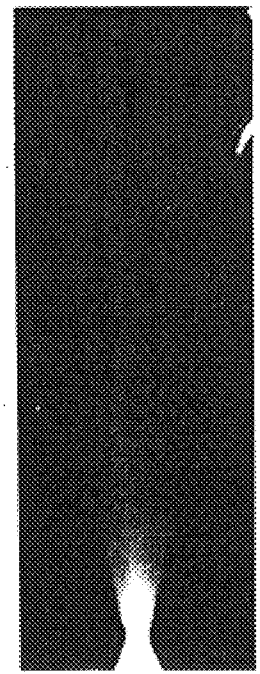 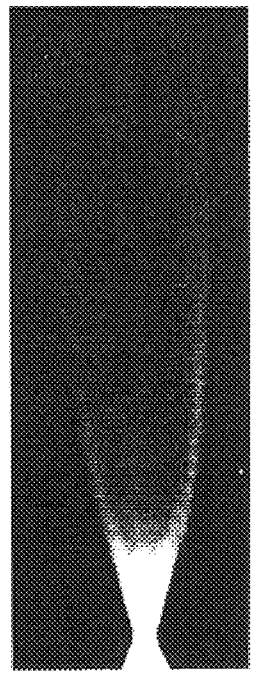
FIG. 5A　　FIG. 5B　　FIG. 5C　　FIG. 5D

Vertical Scale 100 λ, Horizontal Scale 10 λ

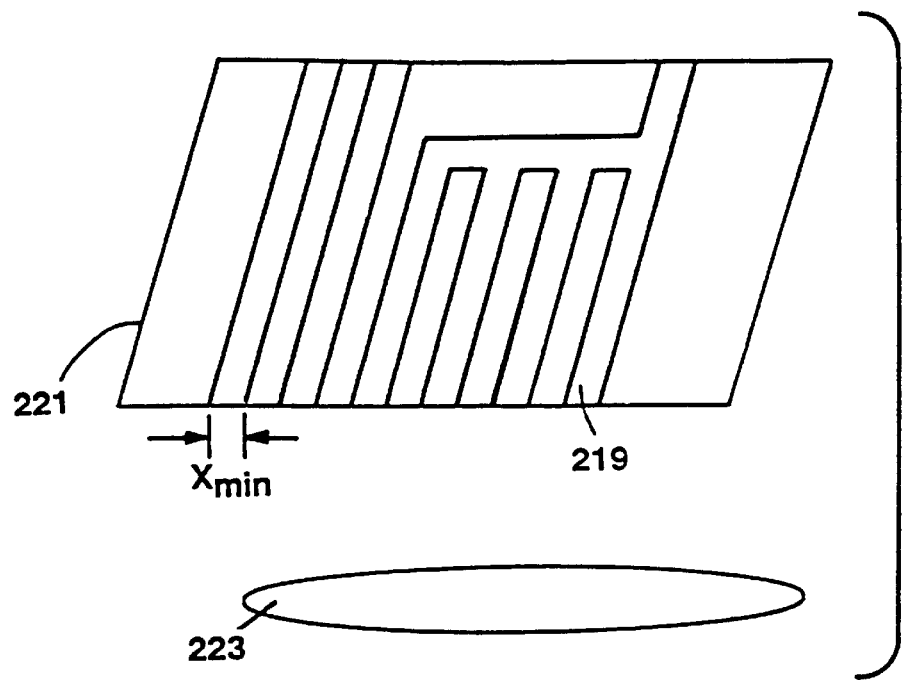
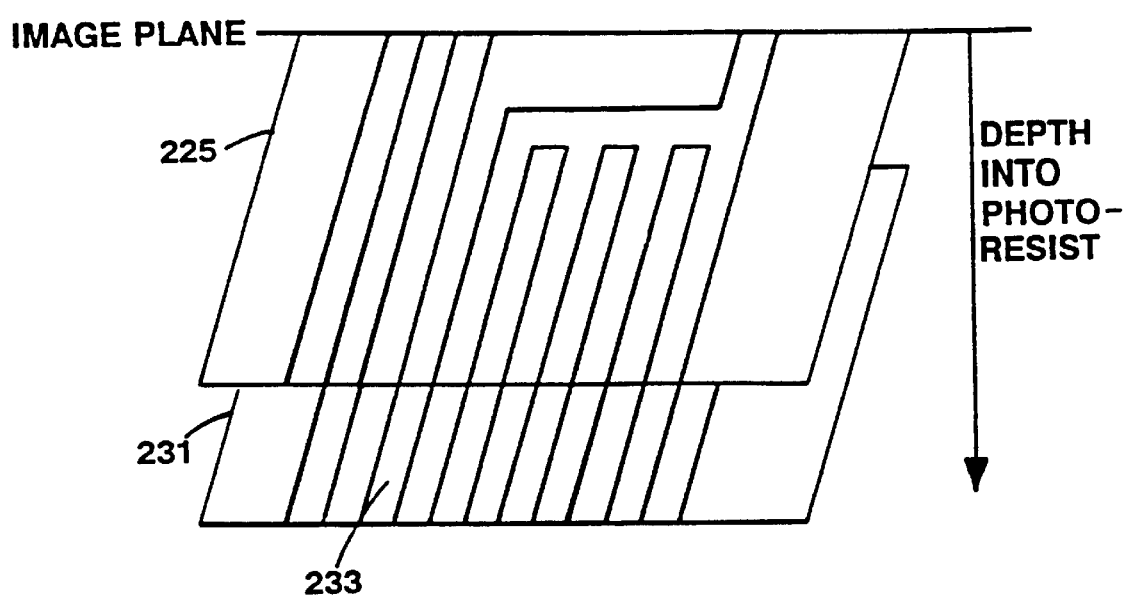
FIG. 25

SELF-TRAPPING AND SELF-FOCUSING OF OPTICAL BEAMS IN PHOTOPOLYMERS

This application is a divisional of U.S. application Ser. No. 08/981,181, filed Jul. 16, 1998, U.S. Pat. No. 6,274,288, and claims priority under 35 U.S.C. §119 from PCT Application US96/10151, and provisional application Ser. No. 60/000,154, filed Jun. 12, 1995, and provisional application Ser. No. 60/007,876, filed Dec. 1, 1995, each of which is hereby incorporated by reference in its entirety.

This invention was made in the course of work done under a U.S. Department of the Navy contract and is subject to the provisions of Public Law 96-517(35 U.S.C. §202) in which the contractor has elected to retain title.

FIELD OF THE INVENTION

The present invention relates to changing optical characteristics by application of radiation in a way which tends to contain the radiation. More specifically, an aspect of the present invention relates to using radiation to change characteristics of a polymer in a way that induces the polymer to better contain the radiation, e.g., using self-trapping and self-focusing.

BACKGROUND AND SUMMARY

Many applications are known for carriers and modifiers of radiation. Optical radiation, for example, can be contained by optical waveguides (e.g., optical fibers) and guided from one source to another. Lenses are often used for focusing optical radiation. One desirable characteristic of many of such devices is their ability to contain the radiation, i.e., to minimize the amount of the radiation that escapes from the desired location to undesired locations. A medium that better contains the radiation is more efficient.

Many polymers are physically changed when radiation is applied thereto. For example, the optical index of refraction of a photopolymer changes when it is exposed to optical radiation, i.e., light. However, usual changes in index of refraction based on this kind of photopolymerization exhibits a relatively slow response to optical intensity changes. For example, light-induced changes in index of refraction in a polymer may take on the order of milliseconds to complete.

Throughput, however, is often very important in production of these devices. The prior art has sometimes illuminated the photopolymer with intense light for a short time, to increase the fabrication throughput. The illumination is often turned off before the index of refraction change or any nonlinear optical effects appear. This allows the devices to be made at the maximum speed possible.

One aspect of the present invention goes against this established teaching by using relatively long exposures and inducing an index change in the material of interest during the exposure. Unexpectedly, the materials and operations described herein enable the index change to change the radiation passing properties of the material in a way that tends to contain the radiation that causes the index change. Two different mechanisms are described herein: self-trapping and self-focusing.

The field of high resolution projection photolithography has been limited by the resolution and -of-focus during the stage where patterns are formed. This in turn limits the integrated circuit density that can be produced using these patterns.

The smallest feature size $X_{min}$ that can be projected by a coherent imaging system is $$x_{min} = \frac{\lambda}{2N.A.} \quad (1)$$

and the -of-focus (DOF) is $$DOF = \frac{\lambda}{2 \cdot (N.A.)^2} \quad (2)$$

where $\lambda$ is the wavelength of the illumination and N.A. is the numerical aperture of the optical projection system.

A direct route to patterning smaller features photolithographically is to reduce the wavelength from the i-line standard of today (365 nm) to excimer laser wavelengths (248 or 193 nm). The N.A. is typically 0.5, so the minimum feature size is on the order of the exposure wavelength.

However, many have desired to use even smaller features, e.g., a 0.1 μm (=100 nm) process. At this point, the resolution and -of-focus constraints of conventional optical lithography become severe. Therefore, techniques to extend the performance of optical lithography into this regime are of particular technological and economic significance.

It is hence desirable to reduce the wavelength of the optical beam, for example, to less than 248 or 193 nm. Light sources capable of emitting such short wavelengths and compatible photoresists are uncommon and costly. Therefore, conventional wisdom has implied that the resolution and -of-focus determined by the shortest practical optical wavelength (193 nm) has placed a fundamental limit on further miniaturization of integrated circuits using conventional optical lithography. There is a need for techniques that will enable making smaller features.

In view of this need, the present invention describes new techniques to extend the performance of photolithography by properly tailoring the nonlinear optical response of the photoresist in tandem with the optical exposure. The present invention shows exposure techniques exploiting self-focusing and self-trapping. These techniques provide significant improvement in the resolution and depth-of-focus above the inherent values of the optical projection system, even without replacing the existing exposure tools. These techniques could be used in conjunction with improved exposure tools, e.g., lasers having wavelengths less than 200 nm, or x-ray exposure tools, for even better response.

Self-focusing and self-trapping are two examples of non-linear optical effects which may arise from one of many physical mechanisms. Self-focusing describes the formation of a light induced channel in an illuminated material which confines the optical beam. This channel serves as a lens. Self-trapping occurs when self-focusing substantially exactly counteracts beam spreading due to diffraction. When this happens, the cross section of the light induced channel remains substantially constant with propagation distance over the distance of the self-trapping. Other similar mechanisms also exist. For example, a modified self-trapping effect occurs when self-focusing is somewhat less than beam spreading due to diffraction. In that case, the change slows the rate with which diffraction occurs.

A material exhibits self-trapping or self-focusing when the index of refraction changes in the presence of optical radiation in a way to induces waveguiding of that same optical beam which caused the index of refraction change.

The conditions under which a beam is self-trapped may be quantified. If, for instance, the Gaussian beam waist is $\omega_o$ the beam expands by diffraction in a homogeneous medium having an index of refraction $n_o$ with an angular divergence given by:

$$\theta_1 \approx \tan^{-1}\left(\frac{\lambda}{\pi n_o \omega_o}\right) \quad (3)$$

where $\lambda$ is the wavelength of light in vacuum, and $\theta_1$ is an angle describing the divergence of the beam relative to normal. Beam spreading by diffraction is avoided if the angular envelope given by Eq. 3 is trapped within the waveguide by total internal reflection. That is, light of a certain optical mode will be guided through a medium along a waveguide distinguished by a region of larger index of refraction relative to the surroundings.

In an optical material of this type, the waveguide is called the core, and the surroundings is called the cladding. The guidance condition for an optical waveguide of radius r and index no depends on the index difference An between the core and cladding, as quantified by the following relation:

$$k\, r\, (2\, n_o \Delta n)^{1/2} \geq 2 \quad (4)$$

Self-trapping occurs when this waveguide is formed by the same beam which is trapped by the waveguide. Upon trapping, the beam diameter remains nominally constant, independent of the propagation distance.

In general, the diameter of a trapped beam may be slightly modulated along the propagation direction, as if waveguiding by the medium were due to a periodic sequence of convex lenses. This results in a channel with diameter variations. In this case, self-focusing does not exactly balance diffraction point-by-point along the longitudinal direction. Nevertheless, on average, the beam is trapped.

In the prior art, self-trapping and self-focusing have only been observed for a highly restrictive set of material and exposure conditions which many of ordinary skill in the art have believed to be impractical. waveguiding based on the Kerr effect vanishes when the beam intensity is reduced below a critical value on the order of megawatts per square cm, as reported in Chiao et al., Phys. Rev. Lett., 13, 479–482 (1964). This critical value is typically so large (MW cm$^{-2}$) that self-focusing and self-trapping are difficult to observe with common lasers. Self-trapped beams have also been observed by using the Kerr effect in sodium vapor and in glass.

Alternately, self-trapping has been achieved by two-wave mixing in photorefractive crystals using low intensity optical beams, as reported in Segev, et al., Phys. Rev. Lett., 68, 923–926 (1992) and Duree, et al., Phys. Rev. Lett. 71, 533–536 (1993). Self-trapping by the photorefractive effect requires only low optical intensities (about 10 mW cm$^{-2}$). This guiding behavior arises from a fundamentally different physical mechanism than the Kerr effect. Namely, diffraction is balanced by two-wave mixing among the spatial frequency components of the input beams.

Self-focusing and self-trapping demonstrated in the prior art hence either has required very high optical intensities (for the Kerr effect), or very specialized materials, e.g., inorganic crystals. In these materials, unlike the polymers that are the subject of the present invention, light does not induce an attendant structural change that can be used to define three dimensional structures, such as those in photoresists.

Photopolymers find application among a wide gamut of technologies. For instance, the fabrication of microelectronic integrated circuits often relies on photopolymerization to form resist structures of precise and small dimensions, which are subsequently transformed into circuit elements following additional processing steps. It is an object of the present invention to describe techniques and structure which allow exploiting the self-trapping and self-focusing phenomena in photopolymers.

The present inventors have discovered that nonlinear optical effects occur at low optical intensities in combination with structural changes—For instance, the transformation of a liquid to a solid. This is also used according to another aspect of the present invention to enhance the practical importance and applications of self-focusing and self-trapping.

The propagation of light through an optical material is determined by knowledge of the real n' and imaginary n" parts of the complex index $$n = n' + i\, n'' \quad (5)$$

A common nonlinear optical phenomenon in the prior art takes advantage of a light induced change in the imaginary part of the index of refraction (equivalently absorption) upon exposure. For instance, contrast enhancement layers (CEL) formed of a photobleachable dye are often overcoated on a photoresist to improve the contrast of the projected image as it passes through the layer [S. V. Babu et al., J. Vac. Sci. Technol. B 6, 564–568 (1988), S. V. Babu, E. Barouch, J. of Imaging Science 33, 193–199 (1989), B Davari et al., IEEE Transactions on Electron Devices 39, 967–975 (1992), M. Endo et al., J. Vac. Sci. Technol. B 6, 87–90 (1988), B. F. Oriffing, P.R. West, in Solid State Technology 1985), pp. 152–157, Y. Hiral et al., J. Vac. Sci. Technol. B 5, 434–438 (1987), D. C. Hofer et al., "Characterization of the induction effect at mid-ultraviolet exposure: application to AZ2400 at 313 mn," Optical Microlithography-Technology for the Mid1980's (SPIE, 1982), vol. 334, pp. 196–205, K. Kaifu et al., J. Vac. Sci. Technol. B 5, 439–442 (1987), W. Loong et al., J. Vac. Scm. Technol. B 8, 1731–1734 (1990), T. Ochiai et al., S. Photochem. Photobiol A: Chem. 65, 277–284 (1992), Y. Tomo et al., Polymer Engineering and Science 29, 902–906 (1989). The CEL introduces exposure thresholding through absorption photobleaching. This improves the contrast of the projected image, and has been incorporated into a 0.25 μm i-line process [B. Davaii et al., IEEE Transactions on Electron Devices 39, 967–975 (1992)].

The present inventors have realized that using an optical nonlinearity arising from the real part of the complex index of refraction produces a new result. The real part of the complex index of refraction will be simply called the index of refraction, as is conventional in the art.

When an appropriate liquid photopolymer is illuminated with UV radiation, the exposed regions crosslink to form a solid with a real index of refraction which is typically 0.1 to 0.04 larger than the liquid. This is equivalent to a polymerization reaction. A subsequent development stage removes the unexposed polymer. This operation is often conventionally called a "negative" exposure process in the art.

Alternately, when a solid crosslinked photopolymer is exposed to appropriate radiation, crosslinks may be broken. This is similar to a depolymerization reaction, and is typically called a "positive" exposure process in the art. A subsequent development stage removes the exposed polymer.

The present inventors have found that both of the polymerization and depolymerization chemical reactions lead to changes in the index of refraction upon optical exposure which can produce self-focusing and self-trapping under the right material and exposure conditions as described herein.

The descriptions given herein focus primarily on the index change associated with polymerization reactions. However, it should be understood that depolymerization may be used interchangeably.

As described above, the present invention provides a nonlinear optical method of increasing the resolution and depth-of-focus in projection photolithography above the fundamental limits inherent in conventional linear optics. The invention further provides techniques for forming polymeric microstructure from photosensitive polymer precursor materials by exploiting self-focusing and self-trapping during the exposure stage.

The exposure of photosensitive compositions to radiation alters their chemical structure. The alteration is usually effected through bond cleavage and bond formation. The index of refraction of polymers can increase or decrease upon illumination to radiation of appropriate wavelength. The preferred materials described herein exhibit a property whereby the index of refraction of the respective precursors changes upon exposure to radiation. The characteristics of the exposure are chosen such that the change in index upon polymerization/depolymerization necessarily occurs during the exposure rather than subsequent to the exposure.

The radiation for photopolymerization is preferably optical, e.g., infra red, visible light or ultra violet. It may be incoherent (as produced by a light bulb), partially coherent (as produced by an excimer laser) or coherent (as produced by an ideal laser) and may be intensity modulated in time. Radiation may be directly incident onto a photosensitive composition or may be directed through a radiation transparent container into a photosensitive composition.

One aspect of the present invention provides a technique to reduce or eliminate diffractive spreading of a high resolution image by inducing a barrier to diffraction in the form of a light channel within the photopolymer. In the case of self-focusing, the cross section of this light channel decreases with propagation distance, while in the case of self-trapping, the cross section of this light channel remains substantially constant. More generally, however, the radiation induced light channel counteracts at least some of the diffraction effects which would otherwise exist.

In another aspect of the present invention, a layer of a photosensitive composition is exposed to radiation, thereby forming a region of changed index of refraction in the layer upon which radiation is absorbed. In the case of a negative exposure process, the polymerization reaction leads to the formation of a polymer with increased molecular mass. In the case of a positive exposure process, a depolymerization reaction leads to the formation of a polymer with reduced molecular mass. The spatial profile of the increase in index of refraction has a form defined by the intensity pattern of the radiation incident on the layer.

Preferably, the index of refraction for the preferred materials used herein should increase by at least $10^{-3}$ upon exposure, although the present invention may be usable with materials that are two orders of magnitude less sensitive than this. This change in the index of refraction modifies the propagation of radiation deeper in the material. That is, the radiation propagates effectively through a channel, inducing further polymerization in an adjacent region deeper within the photosensitive composition. As the radiation propagates, the channeling effect counteracts diffraction to varying degrees. For a particular set of material and exposure conditions, self-focusing closely balances diffraction, and the optical beam travels through the light induced channel with a substantially constant cross section.

In an alternate embodiment, the diameter of a light channel at a given point along the channel can be altered by modulating the optical intensity, wavelength, or intensity profile at that point during photopolymerization. These light channels also serve as optical fibers of modulated diameter which can be used for optical data storage or as optical filters, for instance.

BRIEF DESCRIPTION OF THE FIGURES

The present invention will be described with reference to the drawings of the following figures:

FIG. 4 is a photograph of an array of optical fiber of 200 μm diameter and 10 mm length made according to the present invention;

FIGS. 5A–5D are a time sequence of photographs illustrating self-focusing of an optical beam according to the present invention;

FIG. 25 illustrates the preservation of focus of projected mask well below the image plane, in a nonlinear photoresist, due to self-trapping of light pattern.

DESCRIPTION OF THE PREFERRED EMBODIMENTS

Figures 1A, 1B, 1C, 1D:
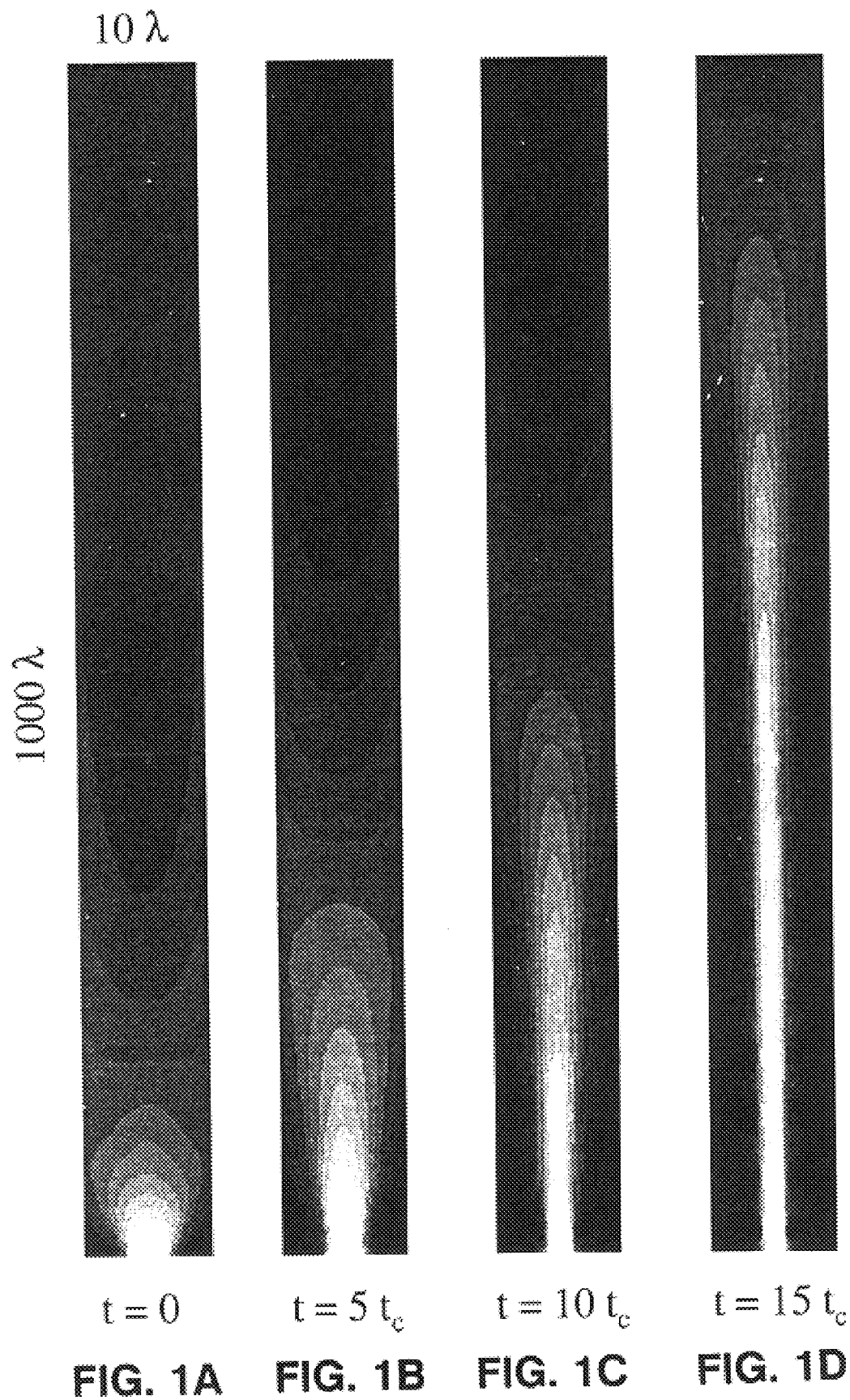
FIGS. 1A–1D illustrate computer simulation of self-trapping according to the present invention.

Radiation changes the index of refraction of a polymer by inducing a photopolymerization reaction. This index of refraction change is a function of absorbed optical energy. The change in the index of refraction promotes the channeling of optical beams propagating through the polymer.

A material described according to this embodiment is optically non-linear, which means that index of refraction changes proportionally to intensity, whether or not that proportion is proportional.

The preferred system of the present invention uses a radiation of between 1 and 100 mw/cm$^2$.

The propagation of light in a photopolymer is described by the scalar, three-dimensional, paraxial wave equation for the optical electric field envelope A in an inhomogeneous medium:

$$2ikn_o \frac{\partial A}{\partial z} + \frac{\partial^2 A}{\partial x^2} + \frac{\partial^2 A}{\partial y^2} + k^2[(n' + in'')^2 - (n_o + in_o)^2]A = 0 \quad (6)$$

This is a form of the basic wave expansion equation, where n and $n_o$ are the spatially modulated and unperturbed complex indices of refraction, respectively, and A is the electric field amplitude. Note that if either n' or n" w is proportional to A, then the system is nonlinear. $k=2\pi/\lambda$ is the wave vector of a paraxial beam propagating along the z direction and $\lambda$ is the wavelength in vacuum. The index of refraction and absorption described by n depend on optical exposure, time and position.

For a typical $\Delta n = n' - n'_o$ in photopolymers of 0.04, the smallest stable diameter of the self-trapped beam is predicted to be 0.6 $\mu$m from Eq. 4. In practice, the actual diameter of the waveguide is expected to be slightly larger because of inefficiencies including the time lag of the index change following exposure, light scattering within the waveguide, diffusion of radicals out of the illuminated region, and the propagation of polymer chains outside of the illuminated region.

The index of refraction of a photopolymer can be changed in many ways. First, the polarizabilities of the individual molecules can be altered by chemical reactions. For example, in diacrylate or triacrylate monomers, the electronic polarizability typically decreases upon photopolymerization because a double bond is replaced by two single bonds.

The relative concentrations of the various components in the photosensitive composition may be tailored, due to diffusion or flow, for instance.

The mass density typically increases upon polymerization, since van der Waals interactions between molecules are replaced by covalent bonds which draw individual precursor units close together into the polymer chains and network.

A density change produces an index change of the form:

$$\Delta n = \frac{(n^2 + 2)(n^2 - 1)}{6n} \frac{\Delta \rho}{\rho} \quad (7)$$

Where $\Delta \rho$ is the density change. This shows that the index increases as the polymer becomes a solid.

For n=1.5, for example, this gives n=0.59 $\Delta \rho/\rho$. Of these three mechanisms responsible for index changes, the latter typically dominates in the photopolymer compositions described here. The largest density change occurs for reactions between small molecules, because the reactive bonds constitute a larger fraction of each molecule. Accordingly, the largest index changes are expected to be about 0.15. For diacrylate and triacrylate precursors, the maximum index changes upon polymerization are +0.05 and +0.03, respectively.

The Kerr nonlinear optical effect described above typically occurs on the order of femtoseconds ($10^{-18}$ seconds). In contrast, a change in index of refraction due to photopolymerization is not instantaneous. Typically, microseconds to minutes are required for the index change to develop, because the chain building response is limited by the diffusion time of the photogenerated radicals. As molecules begin to polymerize, the diffusion constant of the radicals decreases dramatically, so the time response slows.

The parameter n=n'+in" includes a real part representing the index of refraction and an imaginary part representing absorption. Experimental observations of a wide range of acrylate-based photosensitive compositions indicate that the index response to the optical field amplitude A is phenomenologically of the form:

$$\Delta n'(x, y, z, t) = \Delta \hat{n}_o \left[1 - \exp\left(-\frac{1}{U_0}\int_0^{t-\tau} |A(t')|^2 dt\right)\right] \quad (8)$$

where $\tau$ is the monomer radical lifetime. This represents effects from the real part of index of refraction change. The expression for absorption photobleaching is approximately:

$$\Delta n''(x, y, z, t) = \Delta n'_o \exp\left(-\frac{1}{U_0}\int_0^t |A(t')|^2 dt'\right) \quad (9)$$

$U_o$ is the critical exposure to induce polymerization. This represents the imaginary part of the index, as used previously in exposure thresholding. Note that these equations are very material specific and can vary for other materials.

The real part of the index at time t only depends on times prior to t-$\tau$ because the index change associated with a density change occurs once the monomer radical initiates polymerization. This response is delayed from the generation of radicals by a time $\tau$. Alternately, the absorption change associated with photocleavage of the double bond of the photoinitiator typically occurs very rapidly, since the characteristic time is on the order of femtoseconds; ($10^{-15}$ seconds). The induction period apparent for small exposures is reduced or even eliminated in our self-trapping experiments described herein by purging the composition of oxygen scavengers. The curve fit of Eq. 8 then displays good correlation with the data.

Eqs. 6, 8, 9 embody the characteristics of the self-trapping and self-focusing phenomenon in polymers according to the present invention.

A first unique condition on the optical exposure to observe light channeling takes the form of an upper limit on the optical intensity. It is believed that the average intensity should be below a threshold value approximately given by:

$$I_c \leq \frac{U_o}{\tau} \tag{10}$$

where $U_o$ is the critical exposure to cure the precursor (as defined in Eqs. 8 and 9) and $\tau$ is the precursor radical lifetime. A typical photosensitive composition exhibiting trapping, having, for instance, a photoinitiator concentration of 0.005 wt %, $U_o$ around 1 J/cm$^2$, $\tau$ around 100 ms, the average intensity is less than 10 W/cm. This average intensity threshold decreases as the reaction proceeds. This optical nonlinearity is unique in that it occurs only for low average optical intensity. Intuitively, if intense illumination were used, a large number of radicals would be produced in a short time t less than $\tau$ and the precursor would cure completely in the illuminated region, before the optical beam experienced an index change.

A second condition on the optical exposure is a lower limit on the optical intensity. Because of the presence of free radical scavengers, the intensity must be larger than a threshold value to induce polymerization. For intensities lower than this value, free radical scavengers deactivate the photogenerated radicals before they initiate polymerization. The rate of free radical production is proportional to optical intensity. This rate must be larger than the rate of free radical deactivation or termination, which itself is proportional to the concentration of free radical scavengers such as $0_2$. This lower intensity is represented by $I_{lower}$ and is typically is on the order of 1 $\mu$W/cm$^2$.

As the beam propagates, the refractive index near the longitudinal axis of the waveguide rises. Hence the propagation of the beam produces a radiation induced "convex lens" that tends to focus incoming radiation. The critical angle $\theta_c$ for total internal reflection at the interface between the bright and dark regions of the transverse intensity profile (taking the index in the dark region to be $n_o$ and in the illuminated region $n_o+\Delta n$) is:

$$\theta_c = \sin^{-1}\left(\frac{n_0}{n_o + \Delta n}\right) \tag{11}$$

$\theta_c$ is preferably greater than $\pi/2 - \theta_1$ to ensure that the beam propagates through the medium without spreading, where $\theta_1$ is given by the equation (3). The transverse intensity profile of the beam will then remain substantially constant, independent of the propagation distance. This forms a channel within the medium of substantially constant cross section.

Figure 6:
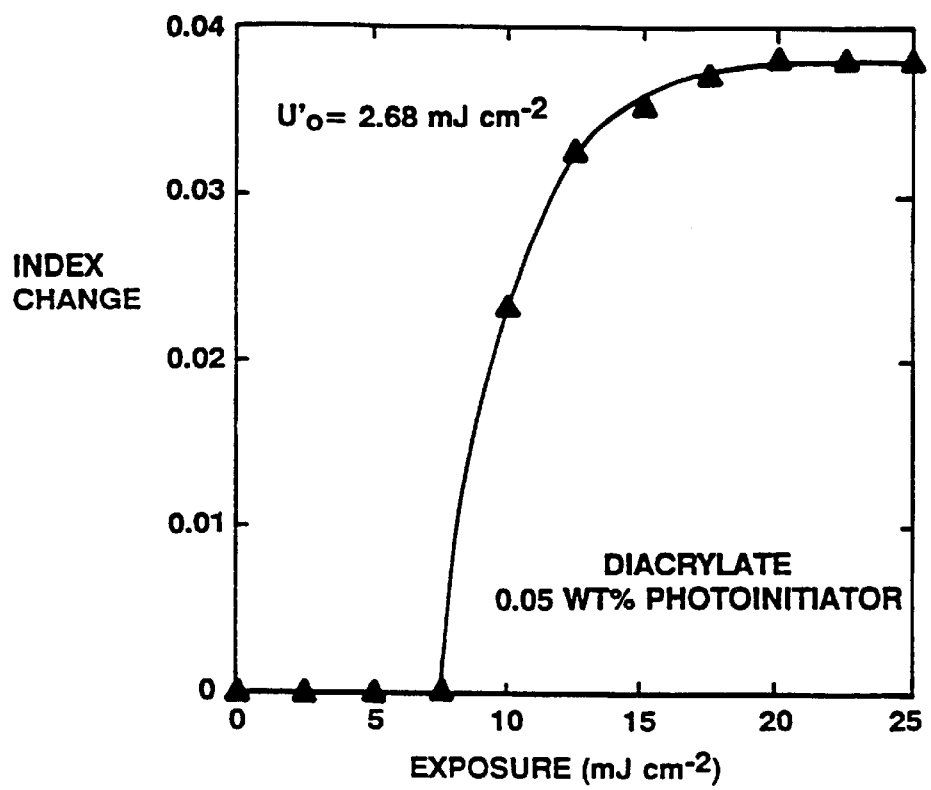
FIG. 6 is a graph of index change during photopolymerization as a function of exposure intensity according to the present invention.

Some fundamental qualitative predictions regarding the evolution of the light-induced waveguide can be deduced based on FIG. 6 and the nonlinear wave equation. FIG. 6 shows an integrated value of intensity-time as the abscissa. At early times, e.g., low total exposure, the material is in the induction period where there is minimal index change. This delay in the material response impede self-trapping. This occurs at values less than 7 mJ in FIG. 6. The induction period effectively causes exposure thresholding. Polymerization is initiated first in regions of higher illumination, so the lateral dimension of the waveguide is smaller than that of the optical beam. The lens-like index profile focuses primarily the central part of the beam. At later times, the index increases with exposure and the index distribution approaches a faithful replica of the transverse intensity profile. Self-focusing is strong and the waveguide propagates through the medium. For large exposures, the index change saturates at the center of the waveguide, reducing self-focusing. At this stage the waveguide becomes essentially a step-index fiber. If the optical beam is strongly confined to the core, the diameter of the waveguide will not increase significantly upon continued exposure. Of course for very large exposures the entire liquid volume may polymerize. While not treated by Eqs. 6. 8, 9, the scatter of light and the diffusion of free radicals beyond the illuminated region also contribute to the termination of guiding. Therefore, the self-trapped beam may be considered as a transient solution. This may effectively place an upper limit on the total optical energy for which self-trapping and self-focusing is observed.

FIGS. 1A–1D illustrate a numerical simulation of the intensity profile of the self-trapped, one-dimensional Gaussian beam in a liquid photosensitive composition. The horizontal scale is magnified by a factor of ten compared to the vertical scale, to improve transverse resolution. The waist of the beam is located at z=0, the input surface of the composition. The beam width at the input is equal to two wavelengths and the propagation distance is 10$^3$ wavelengths.

FIG. 1A illustrates the evolution of the beam through the homogeneous composition before any index changes are induced. The time-steps from left to right are in units of 5 $t_c$, where $t_c$ represents the time to reach the gel point or more generally to attain the critical exposure energy at the location of maximum intensity (z=0, x=0) of the optical beam. The gel point is defined as the point at which the index change is 1–1/e of the maximum index change.

Self-trapping of the optical beam over a distance of more than 500 wavelengths is apparent after an exposure of 15 $t_c$, as shown in FIG. 1D. The oscillations in the beam diameter evident at 15 $t_c$ are characteristic of self-trapped beams. The background absorption length is 10$^3$ wavelengths. Self-trapping according to this embodiment terminates in approximately this distance because the exposure remains extremely weak for distances beyond this.

Self-trapping of optical beams can generate polymeric channels as long as 3 cm with diameters of 10 $\mu$m to 500 $\mu$m. Each fiber-like channel is typically exposed to the optical beam in a time varying manner. A preferred exposure is e.g., 30 times for 1/16 second, with a delay of 1 to 5 seconds between successive exposures.

Figure 2:
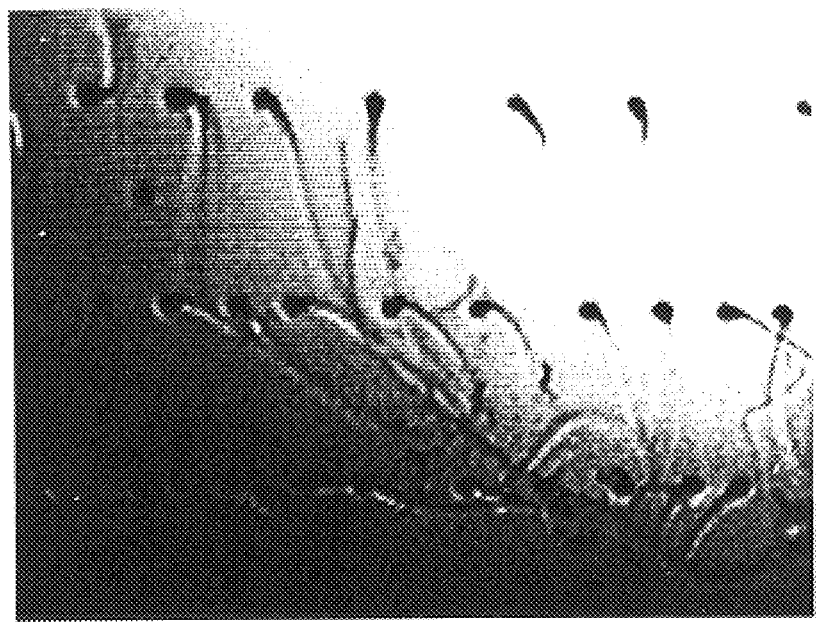
FIG. 2 is a photograph of fibers, nominal diameter 10 μm, grown by self-trapping of UV radiation according to the present invention.

FIG. 2 shows a series of polymer channels of 10 $\mu$m diameter and 3 mm length inside a diacrylate photopolymer emanating from the front surface of a quartz cuvette. The channels can be steered during growth by introducing an amplitude gradient across the transverse intensity profile of the beam. This gradient induces stronger waveguiding to one side of the beam, which tends to deflect the beam.

Figure 3:
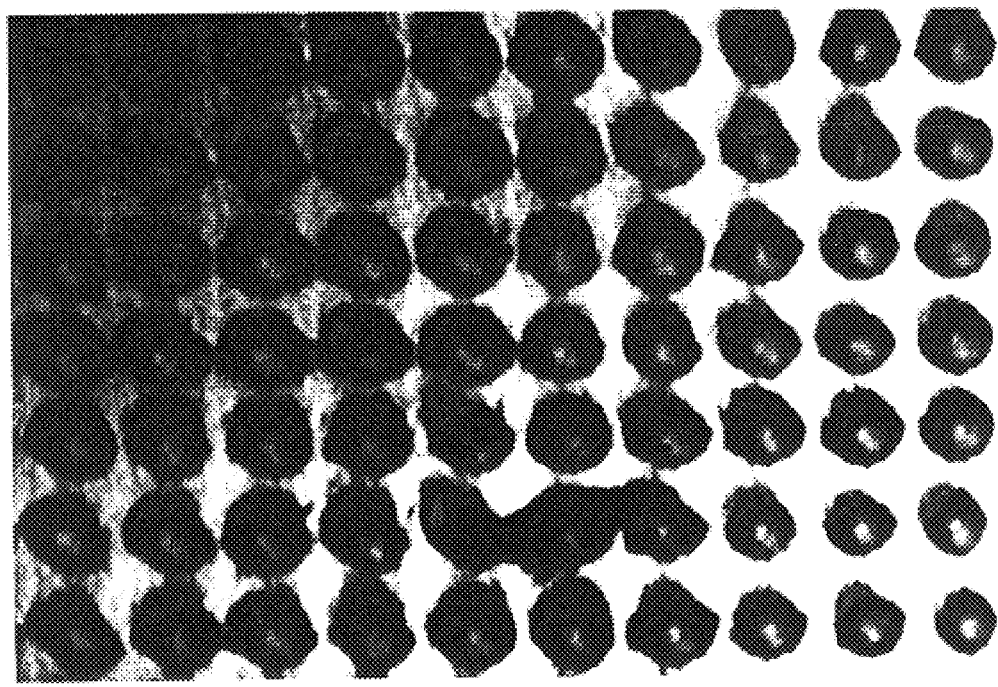
FIG. 3 is a photograph of a three-dimensional lattice of 50 μm filaments made according to the present invention.

FIG. 3 shows an array of fiber-like structures which are fabricated to produce a three-dimensional microlattice. The diameter of each polymer fiber is 50 $\mu$m, spaced by approximately 500 $\mu$m.

FIG. 4 shows regular arrays of cylindrical channels of 200 $\mu$m diameter and 10 mm length as fabricated in an epoxy-triacrylate photopolymer. Each channel was formed using a single 1/8 second exposure, so trapping was not dramatic. Hence, the diameters of the channels are significantly larger than that of channels formed with a series of exposures.

Self-focusing in a liquid diacrylate monomer is illustrated in FIG. 5, The series of photographs records the evolution of a self-focused beam upon photopolymerization of a photosensitive composition including a liquid diacrylate monomer 1,6-HDODA with 0.005 wt %. photoinitiator IRGACURE 369. The input beam was a 5 mW, TEM$_{00}$ Gaussian mode with a wavelength of 325 nm and a beam diameter of 100 µm. The composition was continuously illuminated for 30 seconds with 2 mW incident intensity. The bright (illuminated) regions correspond to the visible fluorescence emitted by the polymer and imaged onto a CCD camera. Time increases from left to right. The left-most figure illustrates the beam profile at t=0 inside the composition. The right-most figure is taken after approximately 30 seconds of continuous illumination.

The FIG. 5A–5D photos show that with increasing time and polymerization, self-focusing becomes apparent as the position of the beam waist moves closer to the input plane. However, the beam waist diameter increases rather than decreases. To optimize self-focusing so the beam waist diameter decreases, the intensity of the input beam can be modulated to allow the slow index time response to keep up with the rapid photoexcitation time response with 2 mW of incident power.

The Precursor

In this embodiment, the precursor refers to the material (e.g., the photopolymer), which has not yet completed its optical based reaction. Suitable precursors for use according to the present invention include polymers or monomers that undergo discernable changes upon illumination, preferably structural changes. These polymers and monomers include those used in photoforming techniques, such as photolithographic and photoimaging methods. The preferred precursors include those in which the index of refraction increase upon photopolymerization is large enough to induce significant light channeling.

Likewise, the viscosity of the precursor is preferably sufficiently high to minimize diffusion of radicals into unexposed regions during the time scale of the optical exposure. Typically, precursors are liquid, although some solid precursors may be suitable as well. Mixtures of polymers or monomers also may be used in the photosensitive composition.

Virtually any polymer can be used according to the present invention for the techniques described herein. Any material that will polymerize to some degree based on applied radiation is a suitable material. The inventors prefer acylates, diacrylates, and triacrylates. However, other exemplary precursors include TMPTA, trimethyloipropane triacrylate, and an epoxy acrylate oligomer, such as EBE-CRYL 600, both commercially available from UCB Radcure, Inc. of Smyrna, Ga. A preferred precursor is an acrylate ester monomer, 1,6-hexanediol diacrylate (1,6-HDODA), also commercially available from UCB Radcure Inc. Alternately, negative and positive photoresists for microelectronics, available from Shipley, IBM and OCG, Inc., are suitable precursors. Suitable precursors are commonly available and specifically sold as radiation curable materials. For example a list of suitable epoxy, acrylate, methacrylate, acrylamide, methacrylamide, acrylonitrile and methacrylonitrile precursor materials are available from Aldrich Chemical of Milwaukee, Wis. The list above is not exhaustive.

Other Components

The precursor can also be treated. Other components can be mixed with the precursor to form additional aspects of the photosensitive composition. For example, photoinitiators may be used to increase the photosensitivity of precursors so that polymerization/depolymerization is induced upon illumination at certain wavelengths for which the photoresponse of the precursor is otherwise slow or nonexistent.

Suitable photoinitiators should be selected according to the photoresponse mechanism for a given precursor. In an alpha cleavage mechanism, benzoin ethers, benzyl ketal, acetophenones, phosphine oxide, or titanocene may be suitable. For a hydrogen abstraction mechanism, benzophenone or related compounds with amine, thioxanthone, camphor quinone or bisimidazole may be suitable. Cationic photoinitiators include aryl diazonium, aryl sulfonium and aryl iodonium salts, and ferrocenium salts. The most commonly employed photoinitiators are benzoin ethers, which are highly efficient radical sources. Photoinitiators are well known and available from many sources, such as the IRGACURE line of products from Ciba-Geigy and the many photoinitiators available from Aldrich Chemical of Milwaukee, Wis. Photobleachable photoinitiators are preferred in order to extend the of penetration of the radiation that mitigates polymerization. Low concentrations of photoinitiators (less than 0.1 wt % of precursor) are used to allow deep thorough curing. Such low concentrations of photobleachable photoinitiators enable thick structures to be formed. Thus, in the case of UV curing, a mixture of benzophenone and 1-hydroxycyclohexyl phenyl ketone, commercially available under the tradename IRGACURE 500 from Ciba-Geigy Company of New York may be used with a precursor whose polymerization mechanism involves alpha cleavage free radicals. The absorption of this photoinitiator at 325 nm is not highly bleachable, limiting the of curing to typically about several centimeters.

For visible cure of 1,6 HDODA at 488 or 514 nm, a perfluorinated diphenyl titanocene photoinitiator such as Ciba-Geigy Co.'s IGRGACURE 784 may be used. This photoinitiator is photobleachable, so high concentrations of photoinitiator may be included in the photosensitive composition to improve the sensitivity of the composition and decrease absorption. High photoinitiator concentrations lead to high extinction coefficients, allowing only a thin layer of the composition to be cured at any one time. Portions thinner than an optical wavelength may be individually cured if the penetration of the incident radiation is less than an optical wavelength. Consequently, it is possible to periodically modulate the diameter of the light induced waveguide to create lateral feature sizes equal to the penetration . This resolution in the lateral (or z) direction can exceed the wavelength of light; it is usually equal to the penetration in the precursor.

Dyes may also form useful components of the composition. The desired effect of such a component is to render the composition photobleachable, thus increasing the contrast of a projected image by introducing exposure thresholding. The typical photon energy to cleave the photoinitiator molecule lies in the UV (about 350 nm) rather than visible spectrum. However, by using the photochemical electron-transfer reaction common among dyes and photosensitizers, visible and infrared light can be used to induce a given precursor to cure. Dyes usually function as an electron acceptor, while a tertiary amine or sulfonate function as a reducing agent.

Since dyes have high extinction coefficients, light generally does not penetrate deep into a dye-containing photosensitive composition. Therefore, curing of thick specimens may prefer a photobleachable dye.

Another embodiment incorporates a dye, before or after photopolymerization, to fabricate devices such as coherent light emitting diodes or lasers which utilize the fluorescence of the dye to generate radiation. Material and exposure parameters are preferably properly selected to achieve self-focusing and self-trapping according to the present invention. The following parameters are important:

(1) The index of refraction change at the wavelength of illumination, i.e., n';

(2) The critical exposure energy to cure the photopolymer ($U_o$);

(3) The photoinitiator radical lifetime $\tau$ which is approximately equal to the time delay between the illumination pulse and the induced index change. It is measured by exposing the photopolymer to a short pulse of light of the order of 10 ms, then monitoring the increase in the index of refraction with time. $\tau$ is approximately the time it takes for the index to reach steady state after the illumination is turned off. The index of refraction can also be measured on an Abbe refractometer, for instance; and (4) Absorption length ($\alpha$) at the wavelength of illumination, which can be measured with a spectrophotometer.

Each of the parameters can readily be measured to determine the proper exposure conditions. Alternately, the optical properties of the composition can be designed a priori by selecting the relative concentrations of the components based on the following considerations:

For the monomer or oligomer: Equation (7) shows that the strongest self-focusing is usually obtained from low molecular weight liquid precursors. These materials are not very dense, but they become denser. They typically undergo the largest relative density changes and therefore the largest index changes upon photopolymerization. Other molecular weight materials can also be used. Moreover, there is a tradeoff between photosensitivity and molecular weight, because it is easier to build up a polymer network starting from larger constituent polymers.

For the photoinitiator: the concentration of the photoinitiators are chosen such that the resulting absorption at the curing wavelength is less than 1/exposed polymer thickness.

For the photobleachable dye (whose index change is based on the imaginary index of refraction): the concentration of the bleachable dye is chosen such that the absorption of the bleached state at the desired optical wavelength is less than 1/exposed polymer thickness. The bleachable dye helps maintain a narrow, self-trapped waveguide diameter by exposure thresholding. This effect reduces undesired curing in the regions of the photopolymer exposed to relatively low intensities.

According to the invention, small features (less than 10 $\mu$m) are trapped for an exposure process in which the material displays large index changes for an average exposure intensity less than the intensity threshold given by equation 10, e.g., less than 1W cm$^{-2}$.

Illumination

Light is absorbed in the photosensitive composition by the initiator, precursor and polymer. Since chemical reactions and diffusion change the distribution of the absorbing species, the local light intensity also changes. The delivery of radiation to the composition should be sufficient to increase the index of refraction during the time frame of the exposure itself.

In the present invention, a wide range of wavelengths may induce polymerization. Typically, wavelengths in the visible, UV or ir spectrum may be used to polymerize the photosensitive composition.

Photopolymerization has been achieved with wavelengths as long as 632.8 nm, by using a dye such as methylene blue and toluenesulfinic acid. The exposure intensity may be as low as 0.6 mJ/cm$^2$.

When a composition (based on a negative-acting precursor) is illuminated with suitable radiation, the exposed regions polymerize to form a polymer having an index of refraction at least 10$^{-5}$ greater than the precursor, more preferably at least 10$^{-3}$ greater than the precursor. Typically, the increase in index is 0.01 greater. This exposure-dependent increase leads to self-focusing and self-trapping, as described above.

It should also be noted that the waveguide may be formed with light of one wavelength through self-trapping, and subsequently a second wavelength can be directed into and guided by the same waveguide.

It is contemplated that methods according to the present invention and the products thereof have widespread and varied applicability. Non-limiting examples of the application of the present invention follow.

Figure 7:
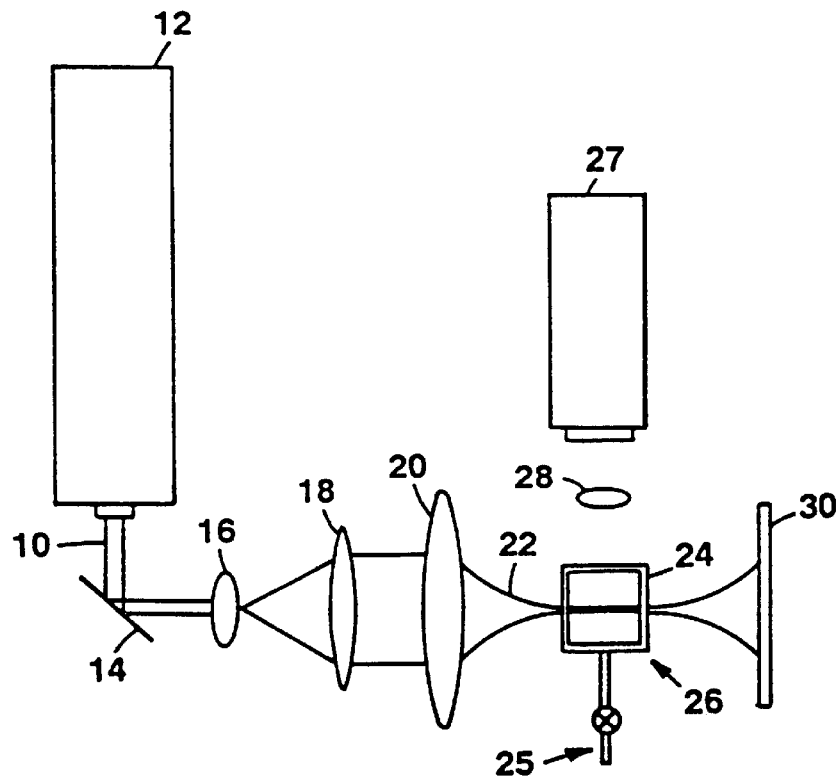
FIG. 7 illustrates exemplary equipment for carrying out methods according to the present invention.

Methods according to the present invention may be carried out using conventional equipment. FIG. 7 illustrates a suitable experimental apparatus for producing polymer microstructure by exposure processes exhibiting self-trapping and self-focusing.

An input beam 10 provided by a light source of an approximate wavelength to initiate photopolymerization 12, is reflected by a mirror 14 and passes through beam expanding lenses 16, 18. The beam is then focused by a lens 20 that directs the focused beam 22 into a container 24, such as a cuvette or quartz cell on a three axis translation stage 25, carrying the photosensitive composition to be polymerized. Container 24 may be connected to an inert gas supply line 26 in order to reduce the presence of oxygen scavengers that detract from the composition's photosensitivity. A camera 27 records the photoresponse of the photosensitive composition during exposure to the input radiation. A lens 28 may be used to image the visible fluorescence emitted during photopolymerization onto the camera. Images, such as those presented in several figures herein, are observed by attaching the camera 27 to a video monitor.

Depth-of-Focus/Resolution Enhancement for Projection Photolithography

In photolithography or other photoforming techniques, the light channeling property within certain polymers can be exploited to reduce the feature size $x_{min}$ (FIG. 23) by a factor of 2 and improve the depth-of-focus by over an order of magnitude.

The typical radiation source for deep UV photolithography is a 248 nm or 193 nm excimer laser. Using standard positive photoresists in a 248 nm stepper, the total resist exposure typically includes 100 pulses of 10 mJ pulse energy and 10 ns duration. For a typical pulse repetition frequency of 100 Hz, the total exposure time is 1 second, and each individual exposure pulse is separated from the others by 10 ms. This relatively long exposure is well suited for displaying self-trapping and self focusing.

Photoresists used for deep UV photography are typically positive resists. Positive photoresists do not typically undergo large density changes upon exposure because they are exposed after the polymer is already in a solid, crosslinked state. Since the density changes produce large index changes, positive resists do not typically exhibit strong nonlinear optical properties due to a light-induced change in the real part of the index of refraction. Negative resists do display large index of refraction changes as light induces crosslinking.

Figure 24:
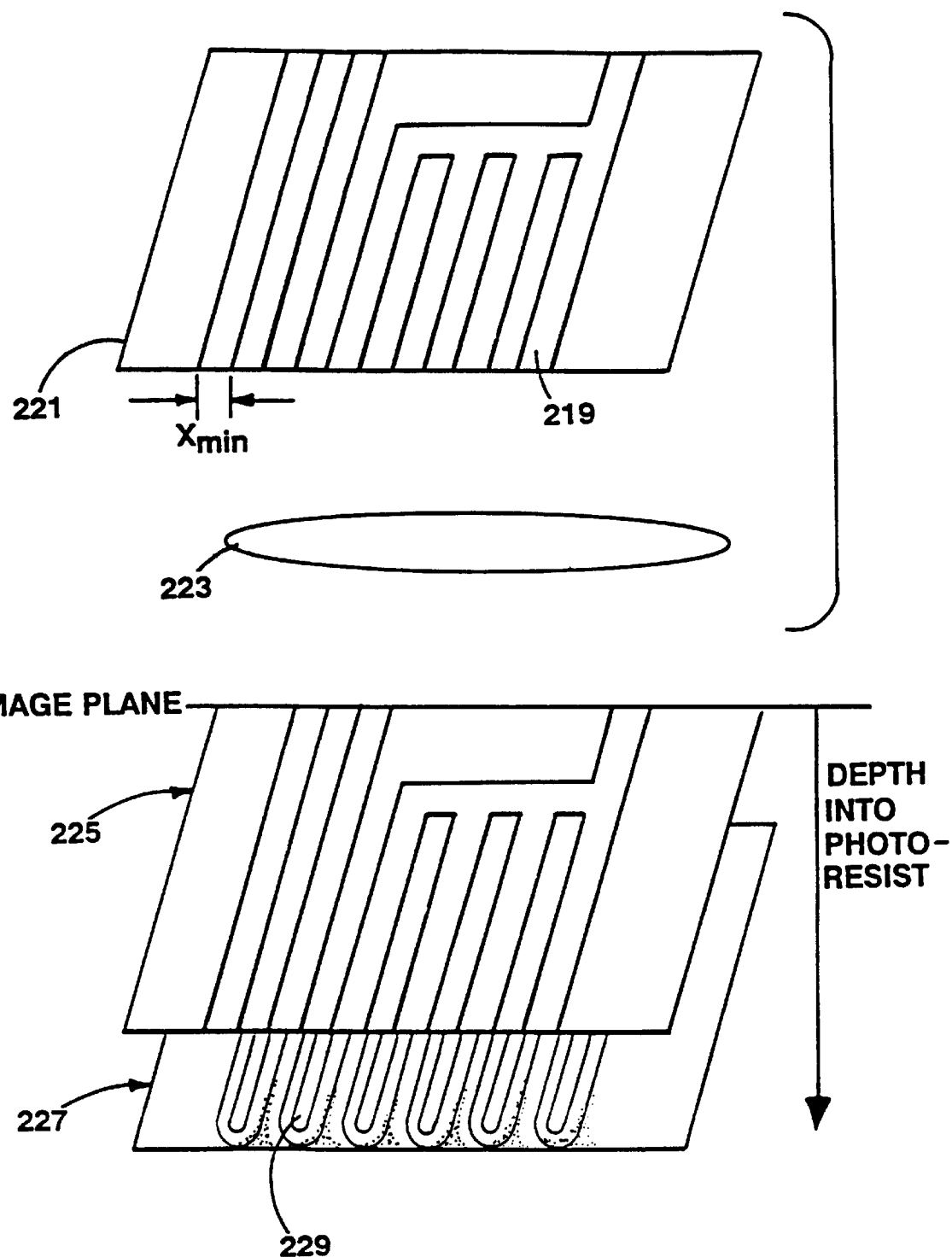
FIG. 24 illustrates the defocusing of a projected mask below the image plane in a standard photoresist.

In the optical projection systems of the prior art, as illustrated schematically in FIG. 24, a photolithography mask 221 having features 219 with minimum dimension $x_{min}$ is projected by a lens system 223 such that the image plane lies on or near the top surface of the photoresist 225. As the image propagates through the photoresist, it goes out of focus within a distance characterized by the -of-focus of the optical projection system. The resulting blurred image 227 results in the distortion of pattern features 229. This blur is undesirable because the fidelity of the photolithographic patterning is sacrificed.

Figure 8:
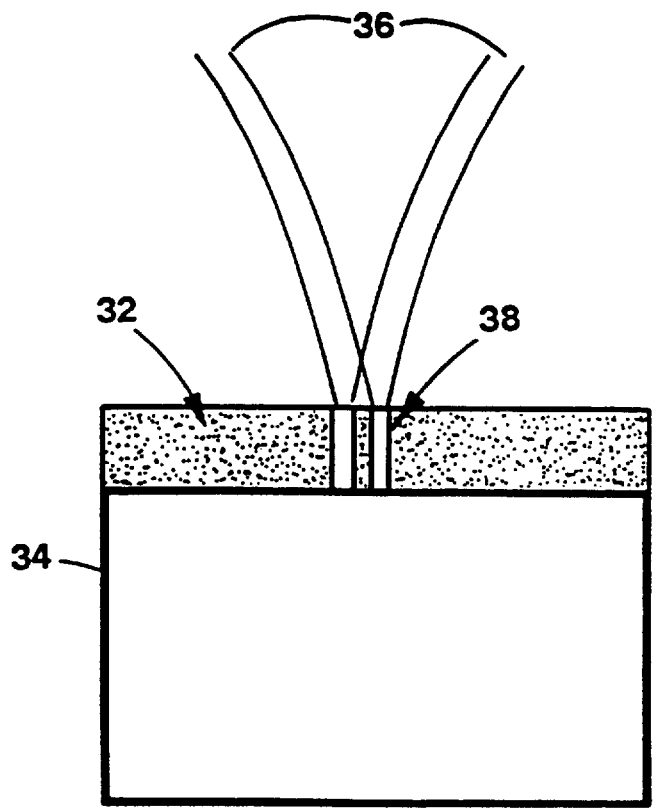
FIG. 8 illustrates schematically a single layer for resolution depth-of-focus enhancement in photolithography according to the present invention.
Figure 9A:
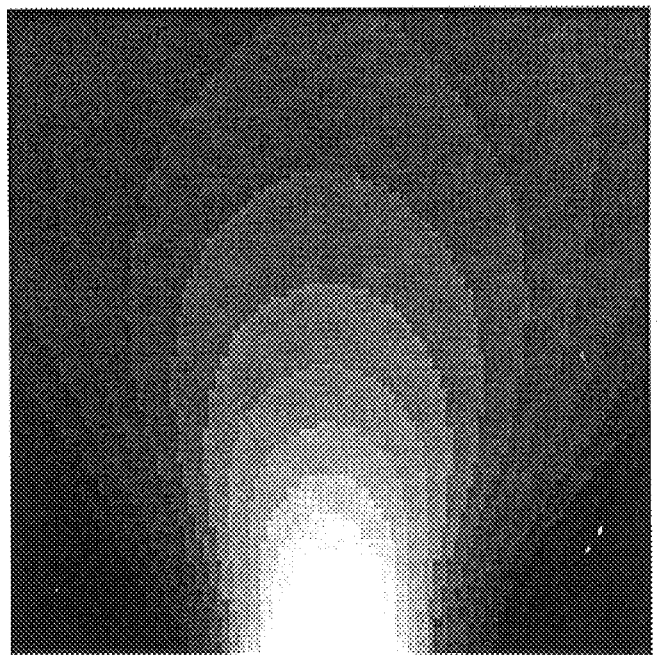
FIGS. 9A and 9B illustrate computer simulations of self-focusing in a resolution enhancement layer according to the present invention before and after photopolymerization.
Figure 9B:
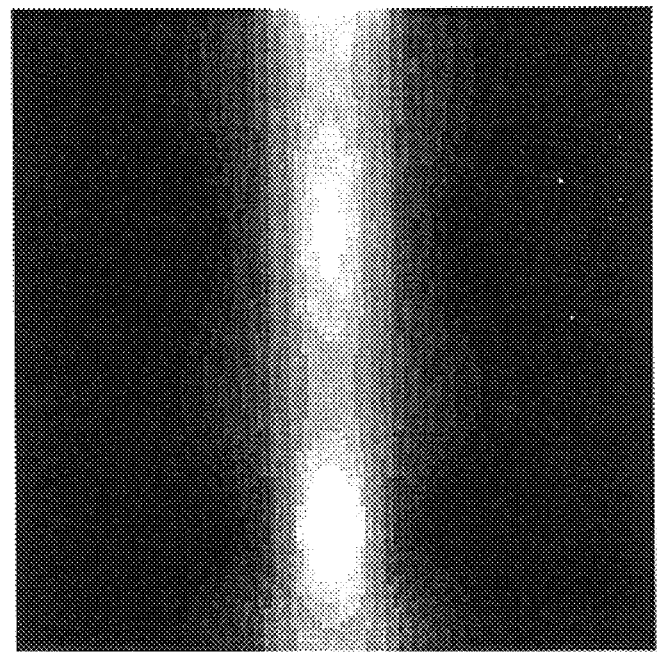

A preferred embodiment of this technique to enhance the -of-focus is illustrated in FIG. 8. In this single layer embodiment, a nonlinear photosensitive composition layer 32 has been applied to a substrate, e.g., a semiconductor wafer 34. The composition is illuminated with an optical beam 36, e.g., UV radiation. Light guiding channels 38 are formed in the exposed composition. The cross sections of the channels nominally decrease and then preferably become constant due to self-focusing and self-trapping as the light pattern passes through the photoresist. Numerical simulations (FIG. 9) of the propagation of a line feature (such as an interconnect) through a resolution enhancement layer indicates that feature size can be reduced by more than a factor of 2 upon propagating 20 wavelengths, and the depth-of-focus can be extended more than a factor of ten.

An optical projection system using this single layer photoresist is illustrated schematically in FIG. 25. A photolithography mask 22 having features 219 with minimum dimension $x_{min}$ is projected by a lens system 223 such that the image plane lies on or near the top surface of the photoresist 225. As the image propagates though the photoresist, it remains in focus over a distance greatly exceeding the depth-of-focus of the optical projection system. The image 231 remains in focus throughout the photoresist, preserving the fidelity of individual pattern features 223. This preservation of the image fidelity throughout the thickness of the resist allows significantly thicker photoresist layers to be patterned than that attainable in the prior art.

Figure 10:
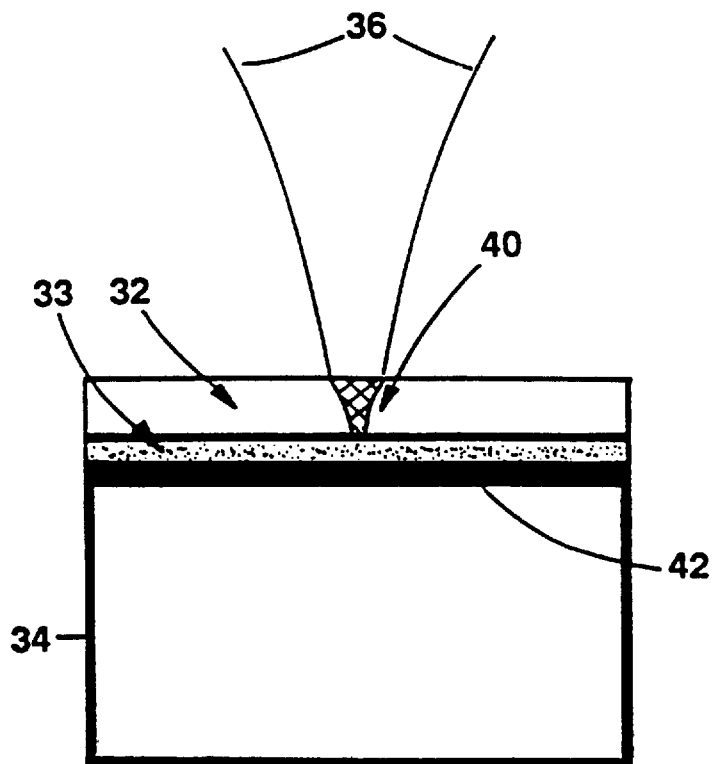
FIG. 10 illustrates schematically a double layer for resolution/depth-of-focus enhancement in photolithography according to the present invention.

A double layer photoresist for applications to integrated circuit patterning is shown in FIG. 10. A nonlinear photosensitive composition layer 32 is applied over a conventional photoresist layer 33 on a substrate 34. Upon photopolymerization with an optical beam 36, a light-induced channel 40 forms in the nonlinear photosensitive polymer layer. Typically the beam carries an image having a large number of elements such as electrical interconnects comprising a layer of an integrated circuit, for example. The top nonlinear layer reduces the line width of the pattern elements 42 as the light propagates through the top nonlinear layer and is demagnified and confined by a channel of ever decreasing cross sectional area. The channel funnels the optical energy into the underlying photoresist 33, thereby exposing it to a light pattern of reduced feature size. This enables circuit patterns with minimum feature sizes less than that of the optical projection system to be patterned within the photoresist and subsequently converted into circuit elements. The realization of this example is even further improved if several material considerations are addressed:

1. The viscosity of the precursor incorporated into the resolution enhancement layer is preferably sufficiently high to minimize diffusion of radicals into unexposed regions during the time scale of the optical exposure.
2. The photosensitivity of the resolution enhancement layer is preferably high enough to avoid sacrifice of process throughput.
3. The rate of polymerization within the resolution enhancement layer is preferably fast enough so that light is focused before the underlying photoresist is exposed.
4. The exposure necessary to induce self-focusing in the resolution enhancement layer is preferably lower than the optical energy needed to induce polymerization in the underlying photoresist layer.

In an alternate embodiment, a photobleachable dye between the resist and nonlinear polymer will impede polymerization of the underlying photoresist before the light channels are formed in the resolution enhancement layer.

5. The optical intensity is preferably less than an intensity threshold dictated by the nonlinear response time of the polymer, which is typically in excess of 1 ms.

Figure 18:
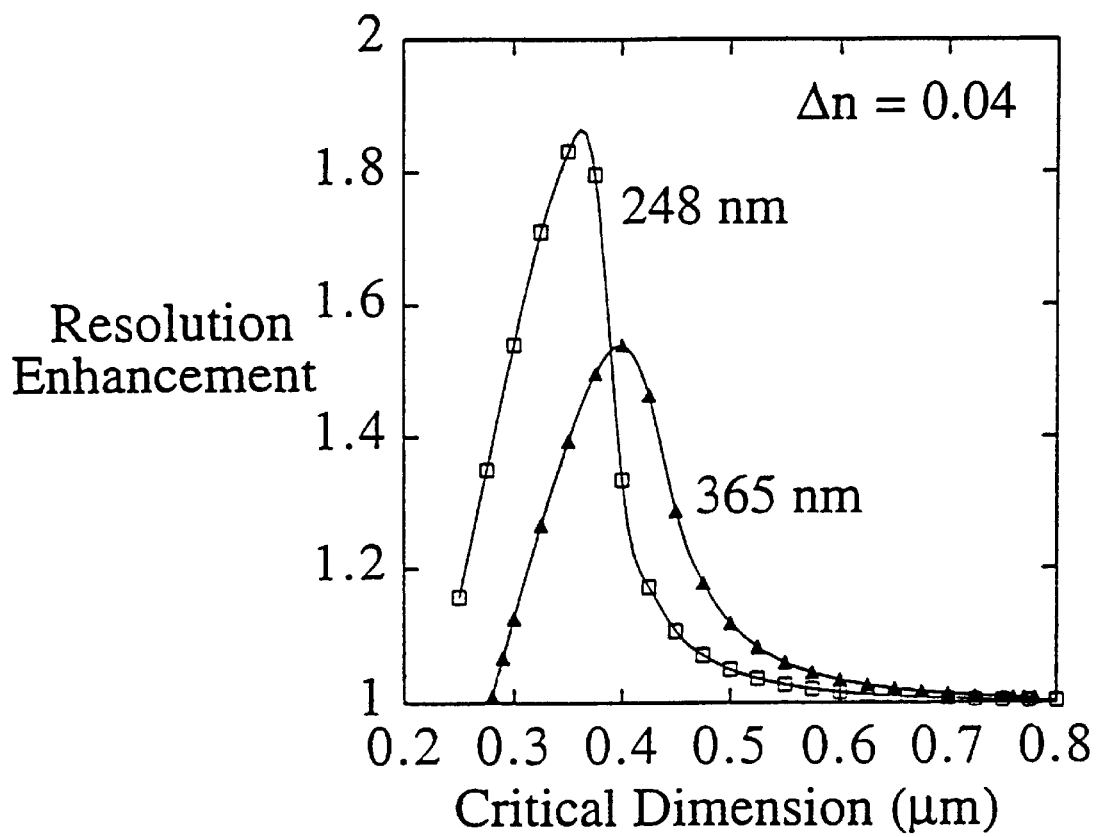
FIG. 18 illustrates calculations of the amount of resolution enhancement achieved in a typical nonlinear optical polymer upon projecting circuit pattern elements of a given width.

The self-focusing properties of the double layer photoresist can be approximated by modeling the index profile responsible for focusing a Gaussian beam as a truncated quadratic. The focusing properties of this optical system under the paraxial approximation are well known. For instance, it can be assumed that the waist of a one dimensional Gaussian beam is incident on the top surface of a nonlinear photopolymer overcoating a standard photoresist. The feature may represent one interconnection on an integrated circuit. As this line propagates through the photopolymer, the line width is reduced. FIG. 18 illustrates the computed resolution enhancement factors upon passing through the photopolymer at two common wavelengths for photolithography, 248 nm and 365 nm, for a light induced index change of 0.04, In practice, the index change can be larger.

Figure 19:
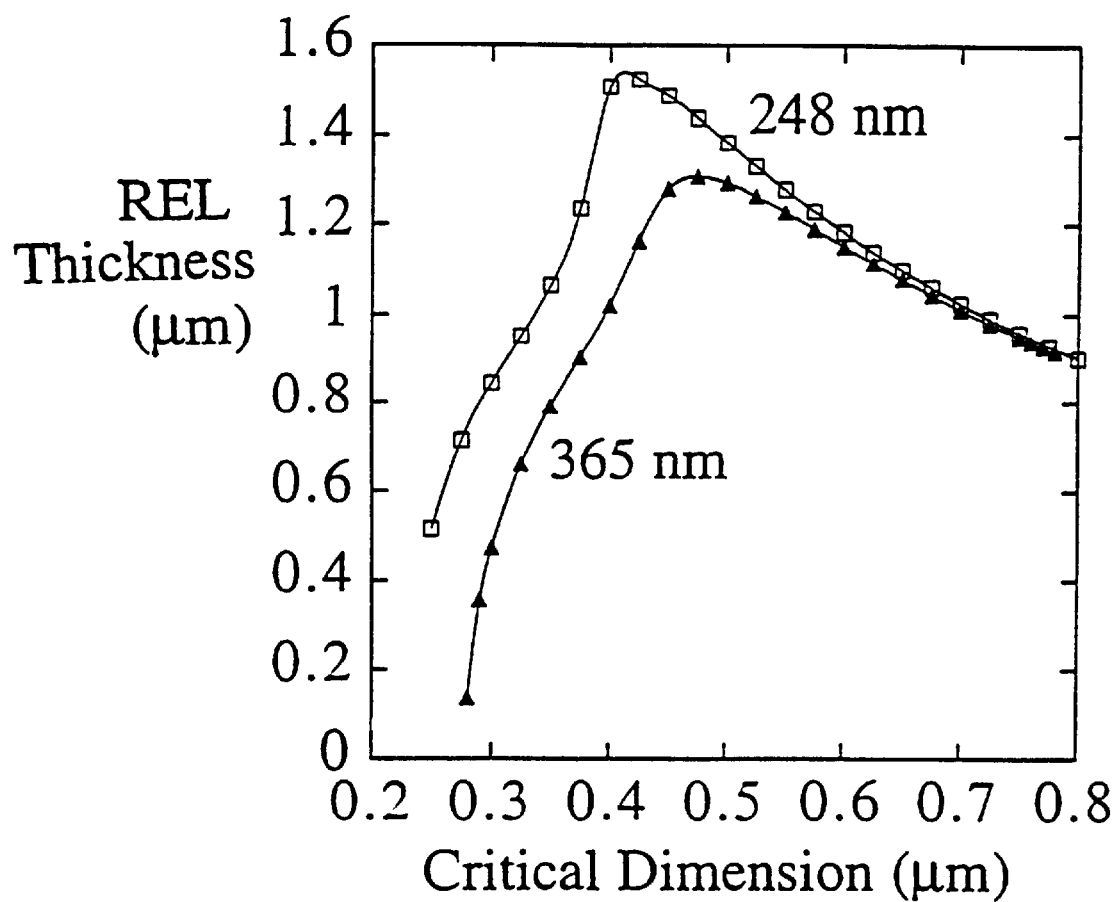
FIG. 19 illustrates calculations of the required thickness of nonlinear optical polymer for photolithography resolution enhancement.
Figure 20:
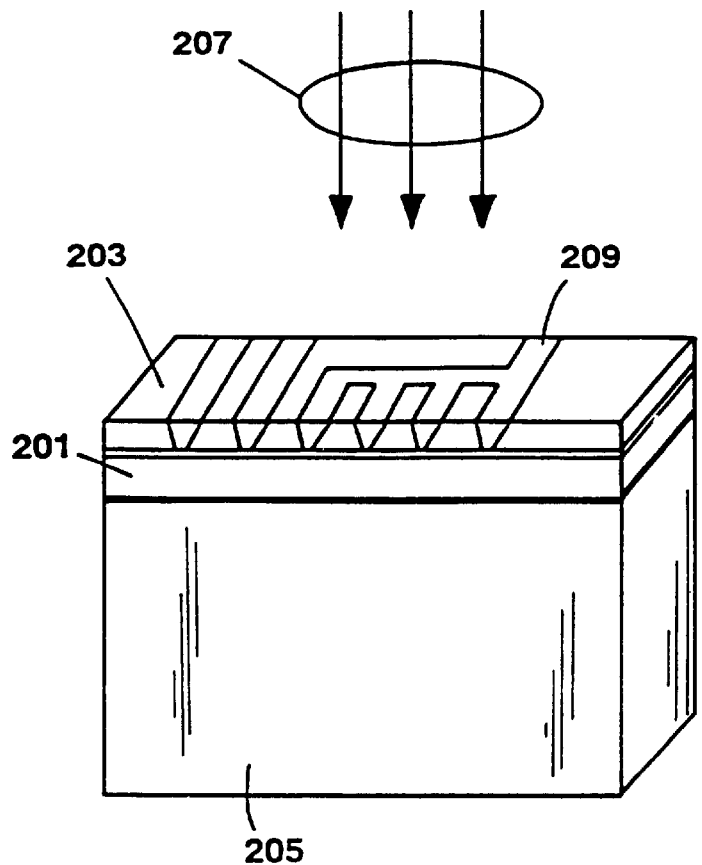
FIG. 20 illustrates the first exposure stage of a multilayer photoresist to form light focusing layer.

The resolution enhancement factor is defined as the ratio of the line width of the optical projection system to the line width after propagating through the nonlinear polymer. FIG. 19 illustrates the corresponding thickness of the resolution enhancement layer which generates this focusing power for a light induced index change of 0.04. Note that the focusing properties depend strongly on the line width itself. Therefore, this resolution enhancement method may be optimal for lithography patterns composed of regular features.

Theoretical predictions based on the measured index changes upon polymerization suggest that the optimal enhancement layer thickness for semiconductor fabrication processes at 248 nm with 0.3 $\mu$m feature sizes is less than or equal to 1 $\mu$m. If the waveguiding is strong enough, the channel traps the optical beam, dramatically extending the -of-focus.

The embodiment that includes the addition of a photobleachable dye in the photosensitive composition used for resolution enhancement will eliminate oscillations in the beam diameter and trap the beam at its smallest diameter through the additional optical nonlinearity of exposure thresholding.

Of course a typical photolithography mask is not formed simply of lines and circles as our discussion has implicitly assumed. However, for certain critical patterning stages this technique is of great value. On the other baud, deleterious nonlinear optical effects such as self-defocusing and distortion arising from this same phenomenon should be avoided. Photoresists may also exhibit a reduction of the index of refraction upon optical exposure, leading to undesired de-focusing.

Resolution/Depth-of-Focus Enhancement for Projection photolithography using a Resolution Enhancement Layer A preferred embodiment of a REL (Resolution Enhancement Layer) for deep UV photolithography uses a multilayer photoresist. The photoresist includes a 0.1–1 $\mu$m photopolymer, such as a negative photoresist, overcoated on a 1 $\mu$m thick photoresist layer. The multilayer photoresist is illuminated with UV radiation at 193, 248 or 365 nm. The optical exposure is formed of a series of short exposures, the duration of which allows the index change to develop between consecutive exposures. Upon complete polymerization, the index of refraction of the polymer has increased by 0.01 to 0.1. This forms a channel that focuses features of typically 0.25 µm to a size of 0.15 µm. As a result, features exposed in the positive resist are nominally 0.15 µm in width and the -of-focus through the polymer is enhanced by greater than 2.

Figure 21:
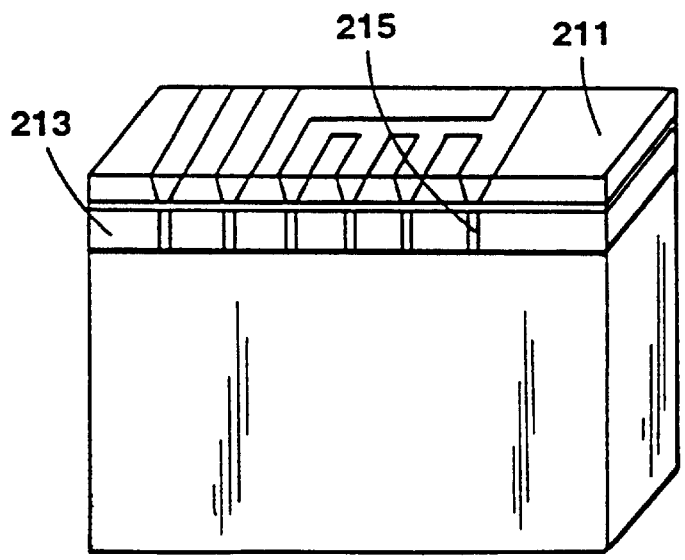
FIG. 21 illustrates the second exposure stage of a multilayer photoresist to expose bottom photoresist through nonlinear photopolymer.
Figure 22:
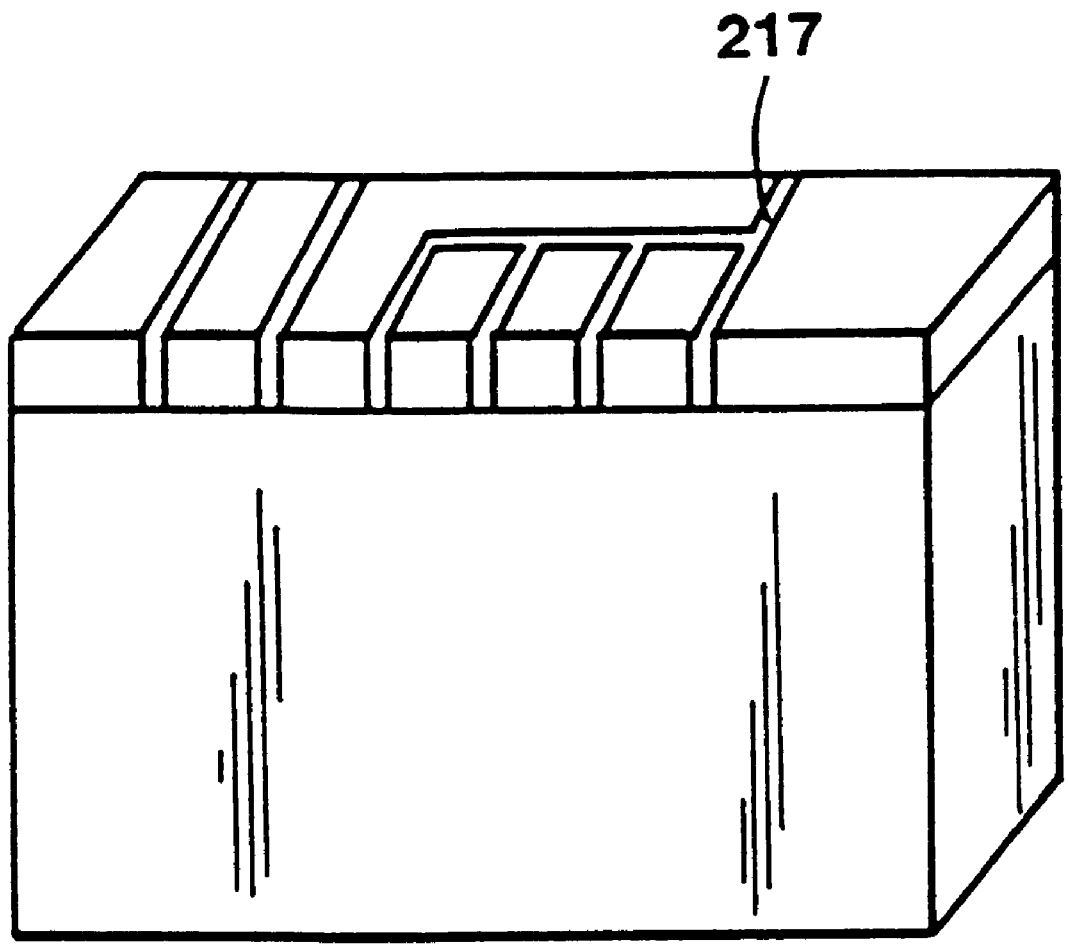
FIG. 22 illustrates the developed pattern exhibiting reduced line width in the bottom photoresist.

FIGS. 20 through 23 illustrate the steps of this embodiment to form a high resolution pattern within a positive photoresist. First, the two layer resist having a positive photoresist 201 and a nonlinear photopolymer 203 deposited on a substrate 205 is exposed to U.V illumination 207. The top layer is a negative nonlinear photopolymer. Upon exposure, the polymer crosslinks to increase the index of refraction locally at 209 and form a light guiding channel. FIG. 21 shows that this light guiding layer 211 can reduce the size of the projected features 215 reaching the positive photoresist 213. The final stage involves developing the multilevel resist, which involves stepping the entire nonlinear polymer and the exposed positive resist below. This leaves a photoresist pattern of reduced line width 217 shown in FIG. 22.

Figure 23A:
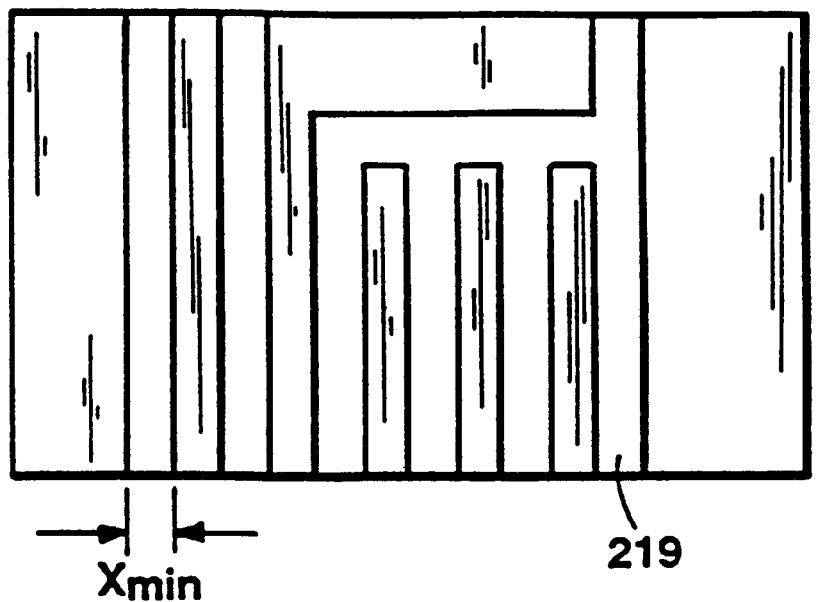
FIGS. 23a and 23b illustrates the developed bottom photoresist with and without the resolution enhancement layer.
Figure 23B:
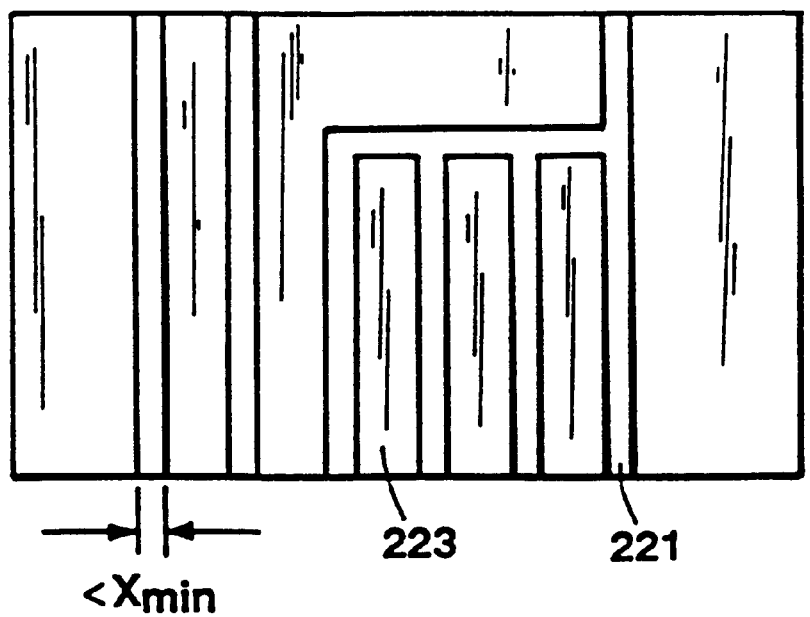

A top view of the developed photoresist pattern before and after the resolution enhancement layer was added is illustrated in FIG. 23. Note that the line width given by $X_{min}$ is reduced by approximately a factor of 2 before 219 and after 221 by the addition of an REL.

For many applications in microelectronic integrated circuits it is advantageous to form narrow features separated by larger spaces. For instance, in the manufacture of flat panel displays, this enables more light to pass through the interconnect layers. Alternately, to manufacture high speed integrated circuits, the parasitic capacitance of the interconnection layers is preferably minimized. One way of achieving this is by increasing the separation between adjacent interconnects. Therefore, in one embodiment of this invention, a resolution enhancement layer increases the space 223 between adjacent lines 221, as illustrated in FIG. 23.

Optical Extrusion for Micromachining

Figure 17A:
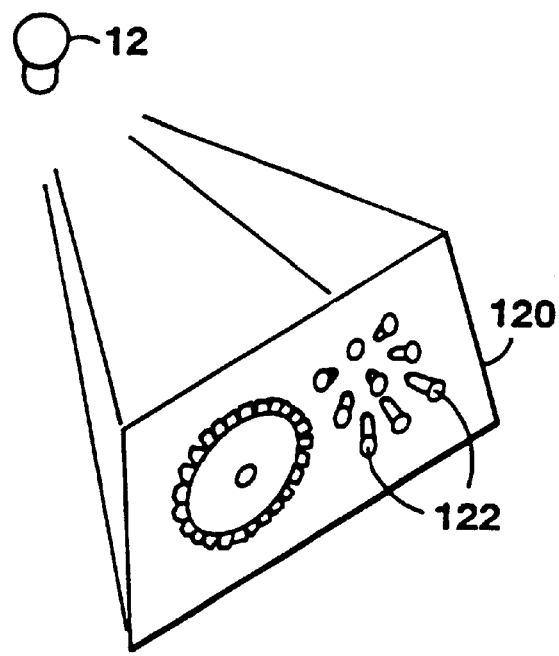
FIGS. 17a and 17b illustrate schematically optical micromachining according to the present invention and a 3D fiber lattice microstructure formed thereby, respectively.

Another embodiment of the present invention relates to fabricating thick polymeric structures by the so-called "optical extrusion" technique. A reservoir of a liquid photopolymer including a precursor is placed adjacent to a photolithographic mask, as shown in FIG. 17a. The mask 120 is back-illuminated by a source of radiation 12 (e.g., a HeCd laser at 325 mn or Hg i-line lamp at 365 nm). Preferably, the light source presents a collimated plane wave. The light pattern is guided through the photopolymer composition due to light channeling without going out of focus due to diffraction effects.

In the prior art, these diffraction effects often play an increasingly significant role for high resolution optical images. The typical defocus length in linear optics, e.g., the depth-of-focus given by equation 1, is typically equal to twice the minimum feature size for standard optics. This places a tolerance on the positioning of the top surface of the wafer relative to the focal plane of the optical projection system. This technique extends that limit imposed by depth-of-focus through the light channeling response of the material.

Light channeling during optical exposure enables a polymeric microstructure 122 whose cross section is a replica of the original mask to be "Extruded." Because this is an additive process, other structures may be "woven in" by projecting the mask with radiation from different directions and locations. Finally, the uncured precursor is removed, e.g., using a solvent, leaving only the desired polymer part, in the case of a negative precursor. In the case of a positive precursor, the solvent removes the exposed regions which have been depolymerized by radiation.

Figure 17B:
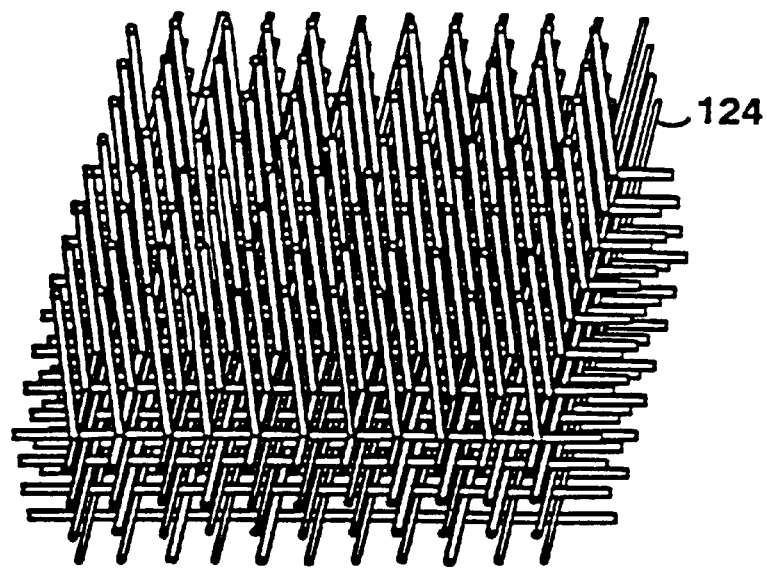

FIG. 17b shows forming a three dimensional fiber lattice microstructure 124. Mort particularly, a reservoir of a photosensitive composition may be illuminated with a bright ring pattern defining the walls of the tubes. The ring pattern may be produced by projecting an appropriate image bearing mask or by illuminating with a "donut" mode from a laser (i.e., incoherent superposition of the TEM 10 and TEM 10 modes) in which the beam has an intensity minimum at its center.

A hollow tube is formed by polymerizing only outside parts of the tube. Polymerization is hence undesirable at the center of the tube. Therefore, polymerization in this region is minimized by operating below the exposure threshold for the precursor.

Following exposure, the unpolymerized composition in the center and outside of the tube may be subsequently drained, leaving only a solid, hollow tube structure. In one embodiment, a composition of 2 parts TMPTA and 1 part EBECRYL 600 and 0.005 wt % IRGACURE 369 photoinitiator are placed within a reservoir at least partially transparent to the exposure wavelength and then illuminated. For instance, a suitable light source is a 10 mW, TEM00 mode at 325 nm supplied by a HeCd laser. The photosensitive composition was exposed to a series of pulses approximately $\frac{1}{16}$ second in duration and separated by 1 to 10 seconds. The average optical intensity was 10 mW/cm$^2$, well below the threshold value described by equation 10.

An array of fiber-like channels is fabricated by periodically moving the cuvette to illuminate a new spot. The fibers grow from the surface of the cuvette adjacent to the point at which the input beam entered the cuvette. Fibers of sufficiently small diameter bend downward at the free end of the fiber under the force of gravity, as the polymer fibers are more dense than the liquid surroundings. Polymerization along each fiber was apparent for approximately one second after each exposure pulse by monitoring the longitudinal evolution of the waveguide. The indices of refraction of the TMPTA monomer and of the TMPTA/EBECRYL mixture were measured to be 1,474 and 1.497, respectively. The indices of refraction for cured fibers polymerized from these photopolymer compositions were measured to be 1.506 and 1.524, respectively, producing index changes of 0.028 and 0.027.

Liquid crystal materials such as those commercially available under the designations ZLI-4330 and E7 from EM Industries of Hawthorne, New York, may be used in concentrations of less than about 50 wt % in any of the acrylate compositions described herein. These liquid crystals may be incorporated into a liquid photopolymer composition before or after polymerization to tailor optical properties, such as birefringence, of the photopolymerized structure. Other useful products that may be formed using methods according to the present invention are coherent light emitting diodes, if for example, the photopolymer composition includes fluorescent dyes. Alternately, three dimensional polymeric microstructure can be used to fabricate photonic bandgap crystals for microwave and optical frequencies, devices using the technique described in E. Yablonovitch, "Photonic band gap crystals" J. Phys.: Condens. Matter 5, 2443–2460 (1993)

Self-Organized Fiber Coupling

Efficient coupling of light from semiconductor lasers to optical fibers is a major technical hurdle. Another embodiment of this invention uses self-trapping polymeric fibers which are grown from the output mirrors of individual lasers. These polymeric fiber sections efficiently capture the light from the laser and funnel it into the polymeric fiber.

Polymeric fiber can then be efficiently and easily coupled to standard optical fiber.

Figure 11:
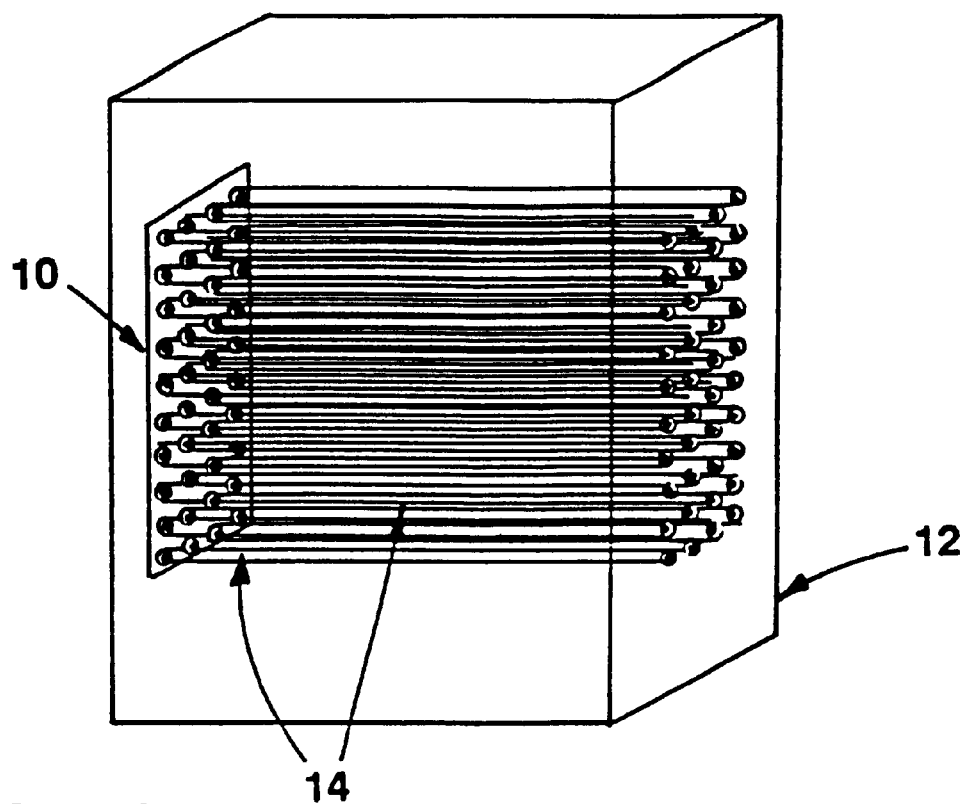
FIG. 11 illustrates self-organized fiber coupling according to the present invention.

FIG. 11 shows optical beams 50 from a laser array which are introduced into a reservoir 52 of a photosensitive composition.

A photoinitiator having a strong absorption at the laser wavelength (e.g., in the near-ir, 0.7–1.5 μm) may be added. Fibers 54 can grow from the surface of the reservoir where the optical beam first comes in contact with the photosensitive precursor. These fibers continue to grow along the beam propagation direction and guide the beam deeper into the precursor. Thus, very efficient and self-aligned coupling to lasers or other light emitting devices are achieved in this way.

The spot size of a surface emitting laser at the exit face of the laser is typically 1–100 μm with 0.7–1.5 μm wavelengths. The typical power of surface emitting laser is I mW. Self-trapping may be achieved by turning the laser on and off to modulate the light intensity. Alternately, the laser can simply be driven to emit a continuous optical output intensity less than that given by equation 10.

A GaAs surface emitting laser having a spot size of 5 μm emits light at a wavelength between 0.7–1.5 μm. The laser front facet is preferably immersed in a container of photosensitive composition capable of being polymerized by the laser output beam. Upon turning on the laser, the beam polymerizes the photosensitive composition at the front facet of the laser, thus forming a waveguide by self-trapping the optical beam.

This technique facilitates efficient laser-to-fiber coupling because the plastic optical fibers formed by self-trapping have large numerical aperture and high light gathering ability resulting from the large index change between the core and cladding of the polymer waveguide. Useful fibers having lengths exceeding 10 cm can be formed. The mechanical strength of the fibers can be enhanced by placing the fibers and the laser within another material having a lower index of refraction. For instance, the waveguides and laser may be encased within a solid potting material of lower index of refraction.

Formation of Optical Fiber Splitters

Figure 12A:
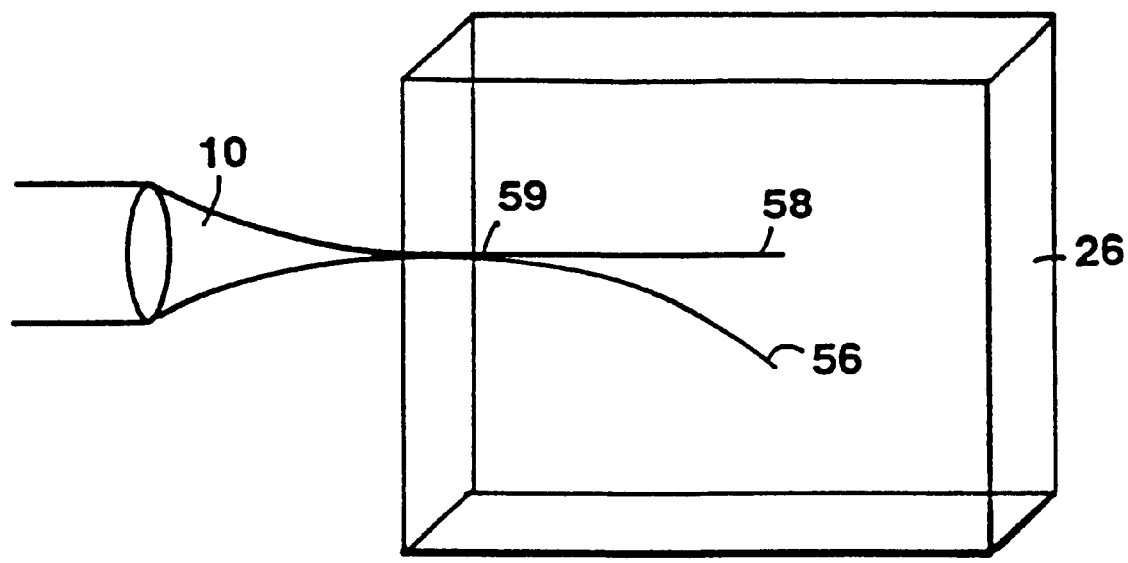
FIGS. 12A and 12B illustrate an optical waveguide splitter formed according to the present invention.
Figure 12B:
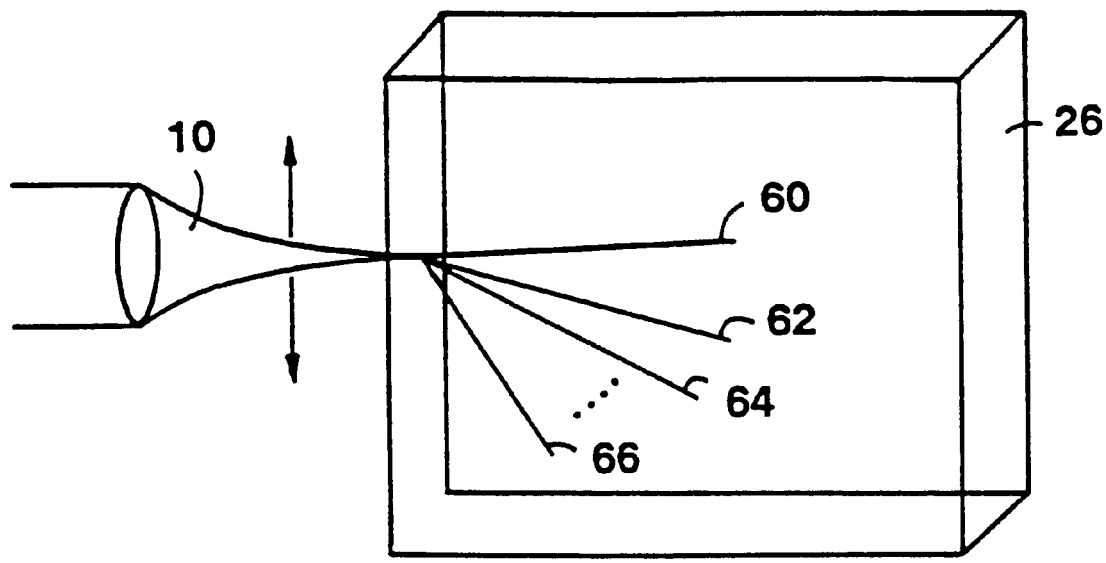

FIG. 12 shows a light source directed into a transparent cell 26 containing a photopolymer composition. Light is emitted from the laser and propagates into the photosensitive composition, forming a fiber 56. The light intensity is chosen to be sufficient to trap the optical beam within a waveguide Subsequently, additional light is directed into the cell so that it crosses the first fiber at some location. This forms a second fiber 58 that is joined to the first fiber at some location within the cell, for example, at the entry point of the first optical beam into the photosensitive composition.

In one embodiment a 1×2 optical splitter 59 is formed from the two fibers and may be used for example, to split the optical signal carried within one fiber into two fibers. FIG. 12 shows an exemplary splitter formed according to the present invention. Following the formation of an earlier fiber, the alignment of the laser beam may be altered, as indicated by the arrows, so that subsequent fibers 62, 64, 66 form along different beam paths into the cell branching from the first fiber 60. The splitter can be "potted" in another polymer of lower index of refraction to enhance mechanical strength and operational stability.

GRIN Lenses

Gradient index (GRIN) lenses focus light according to a modulation of the index of refraction rather than thickness of the lens material. Individual GRIN lenses are typically in the form of cylinders about 1–1000 gm in diameter and 1 mm long.

Figure 13:
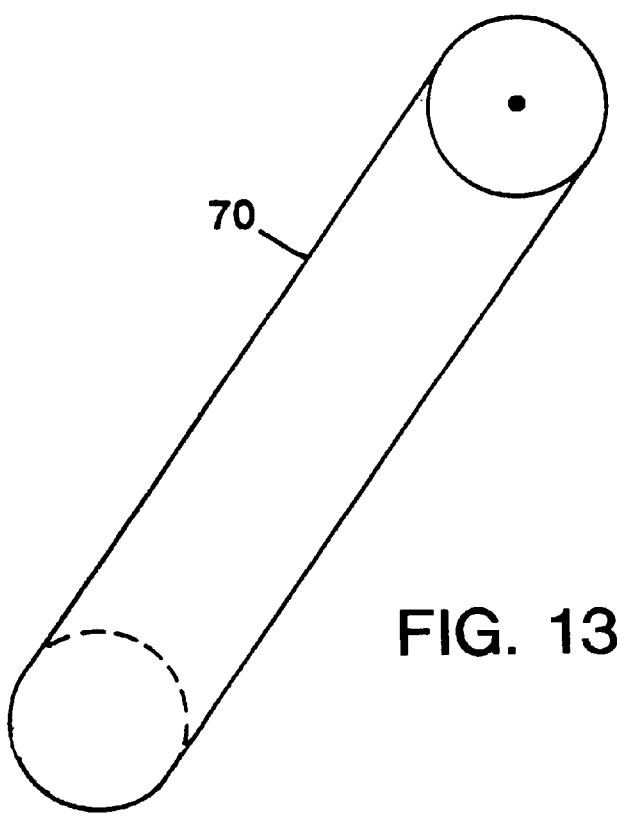
FIG. 13 illustrates a gradient index lens formed according to the present invention.
Figure 14:
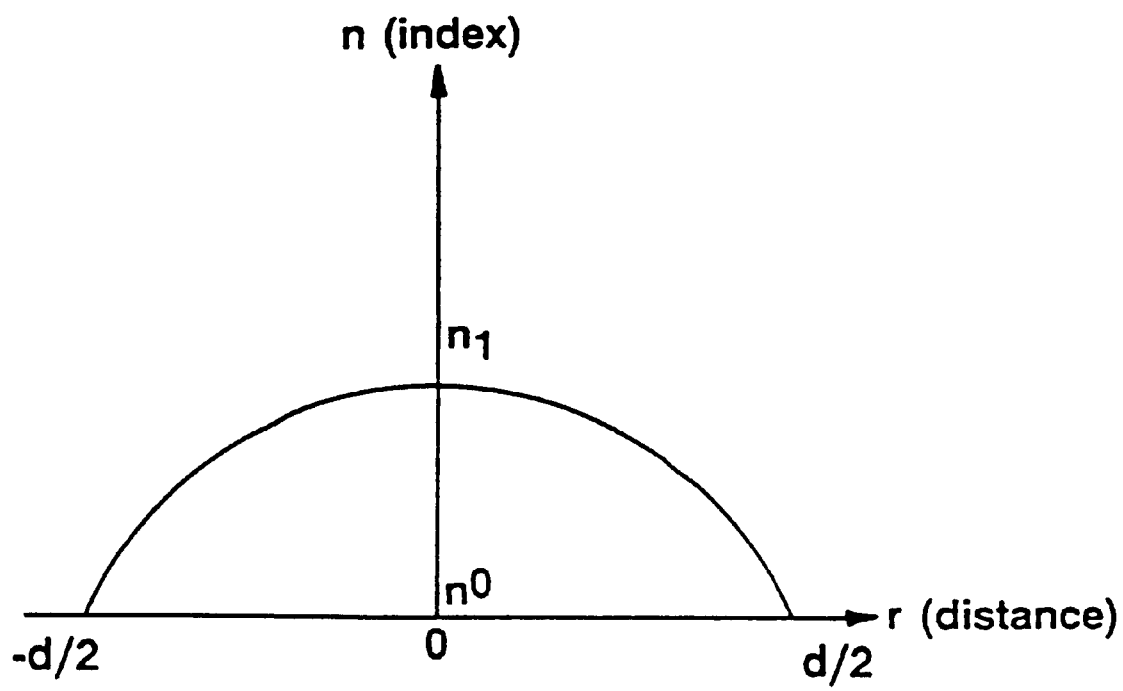
FIG. 14 illustrates an index of refraction profile in a gradient index lens according to the present invention.

A typical GRIN lens 70 is illustrated in FIG. 13. GRIN lenses may be used to couple light from semiconductor lasers to optical fibers or to collimate a laser beam. An example of the index profile in a GRIN lens of diameter d is shown in FIG. 14, where the highest index is along the central axis of the lens. The inventors found that one method to fabricate GRIN lenses of small diameter is by self-trapping.

GRIN lenses may be formed using a procedure such as that followed in optical extrusion embodiment described above. However, the exposure is not taken to saturation, that is, the total optical energy is less than $U_o$ (typically 1 J cm-2), a value which depends on the particular photopolymer composition. In this exposure range, the index of refraction depends approximately linearly on optical exposure, so the index of reflection may be modulated within the fiber itself, thus forming a GRIN lens, An array of fibers can easily be fabricated to produce an array of GRIN lenses.

Optical Data Storage within Arrayed, Corrugated Waveguides

Figure 15:
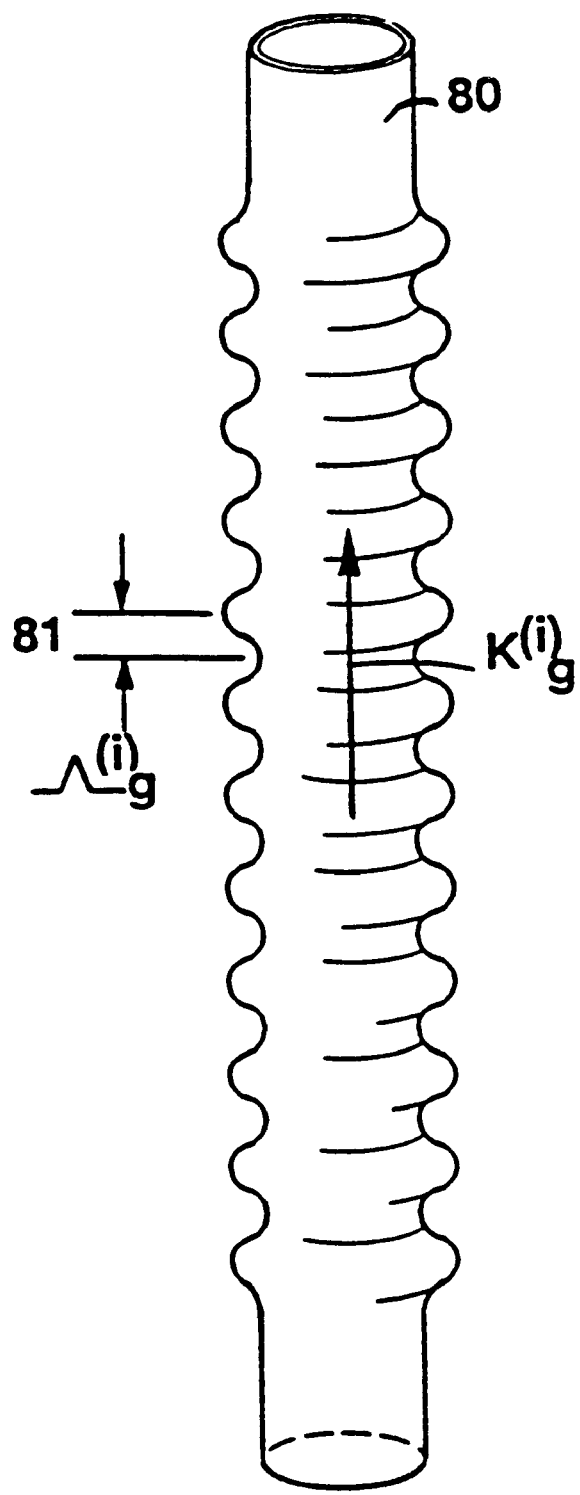
FIG. 15 illustrates a corrugated waveguide of modulated diameter according to the present invention.

Another aspect of the present invention relates to so-called corrugated waveguides. In particular, according to the present invention, different spatial periodicities in the waveguide diameter may be introduced on the walls of the waveguides. Modulation of the diameter couples a forward-propagating optical mode at a particular wavelength with a backward propagating mode of the same wavelength. The theory of such mode coupling is discussed in A., Yariv, "Quantum Electronics" (Fourth Edition, Saunders College Publishing, 1991) and D. Marcuse, "Theory of Dielectric Waveguides" (Second Edition, Academic Press, 1991). An exemplary corrugated waveguide is illustrated in FIG. 15.

A single waveguide acts as a reflection narrow band filter to reject a wavelength λ, for instance, where the period of modulation of the diameter is:

$$\Lambda_g = \frac{\lambda}{2n_{eff}}$$

Thus, the grating period Λg is chosen to reflect a particular wavelength Λ which propagates in a guided mode with effective index of refraction $n_{eff}$ These modulated waveguides enable information to be encoded in the reflectivity spectrum of each fiber. That is, the fiber diameter can be modulated with a sum of spatial periodicities Λg, each periodicity corresponding to a bit of data at a particular wavelength address Λ. The Fourier transform of the waveguide diameter as a function of the longitudinal propagation distance along the waveguide is proportional to the reflectivity spectrum of the waveguide as described by coupled mode theory.

The index difference obtained once any remaining uncured precursor is removed is about 0.5, compared to an index change of less than $10^{-3}$ in ferroelectric photorefractive materials, promoting efficient trapping within the fibers and low "crosstalk" between adjacent fibers.

Figure 16:
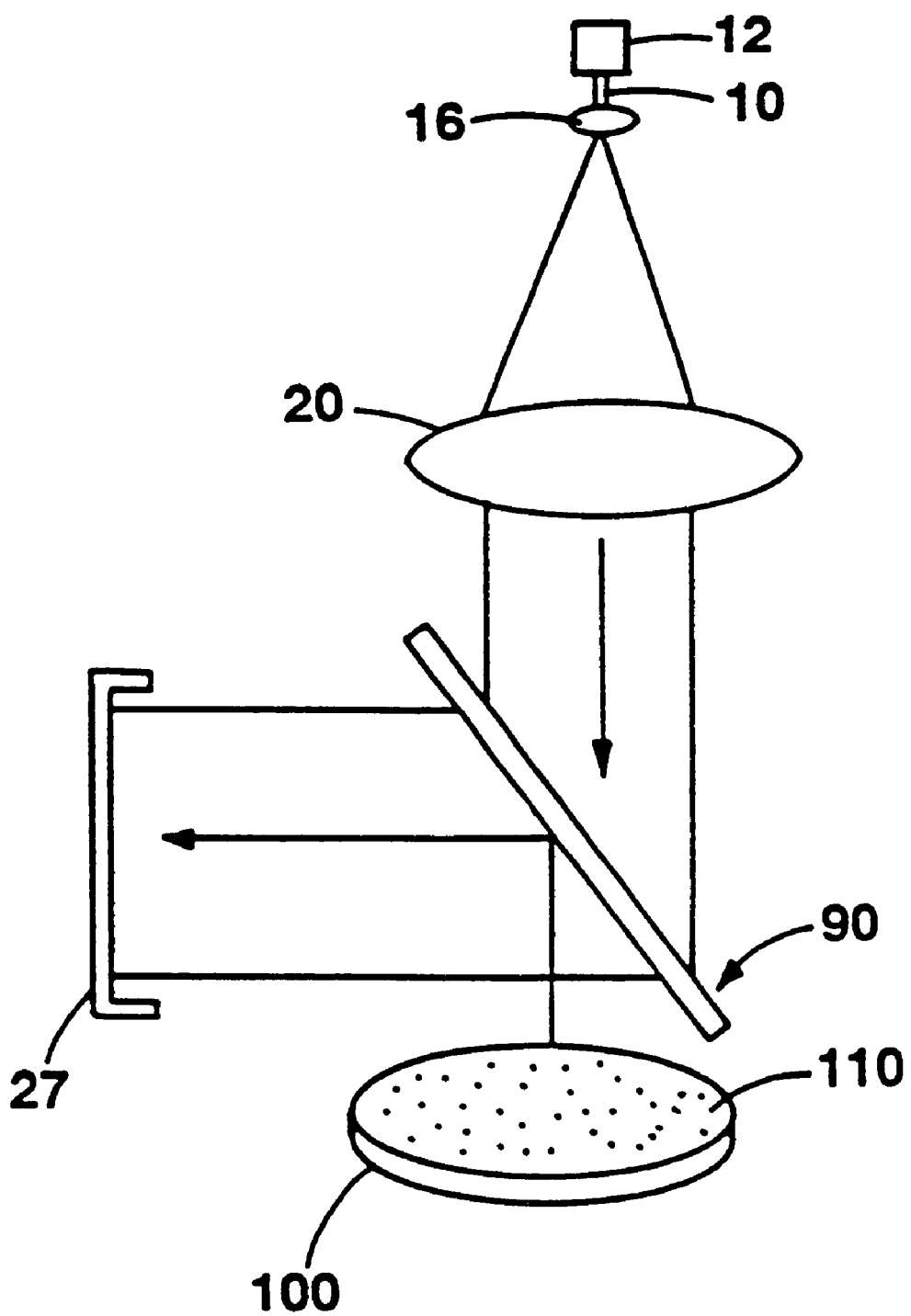
FIG. 16 illustrates an exemplary information storage and retrieval device utilizing corrugated waveguides according to the present invention.

FIG. 16 illustrates an exemplary information storage and retrieval device utilizing corrugated waveguides according to the present invention.

A tunable laser or multi-wavelength source 12 with beam expander optics 16 produces an optical beam 10 for simultaneously reading information stored in several corrugated waveguides 1.00, 102. These waveguides may be arrayed in the form of a compact disk 104, with the longitudinal axis of each waveguide perpendicular to the plane of the disc. Each spatial location 100, 108 on the surface of the disk corresponds to a corrugated waveguide 100, 102 storing a multitude of bits (e.g., 1000 bits or more) which are modulated according to the diameter variation along its length. The system may also include a beam splitter 110 and CCD camera 112. Such a memory architecture has advantages inherent in holographic storage systems, for example, fast parallel access and high information density—$10^{12}$ bits/cm$^3$. In addition, the memory is permanent and the dynamic range is very large, overcoming two of the primary technical challenges of holographic storage systems.

While the present invention is disclosed by reference to preferred embodiments and examples detailed above, it is to be understood that these examples are intended in an illustrative, rather than limiting, sense. It is contemplated that modifications within the spirit and scope of the invention will readily occur to those skilled in the art, and modifications are intended to be encompassed within the scope of the appended claims.

What is claimed is:

1. A method, comprising:

supplying a beam of radiation to a material, the material exhibiting a nonlinear optical response in response to the beam of radiation;

using said beam of radiation to alter an index of refraction of the material in a path of said beam of radiation to form a radiation guiding channel in the material;

supplying an effective amount of said beam of radiation to produce a self-focusing effect in the material which reduces beam spreading caused by diffraction; and controlling a transverse intensity profile of said beam of radiation to steer formation of the radiation guiding channel.

2. The method of claim 1 wherein an amplitude gradient is introduced across the transverse intensity profile.

3. The method of claim 1 further comprising directing a plurality of other radiation beams into the material to form a plurality of radiation-guiding channels based on said self-focusing effect, said radiation-guiding channels being seperate form one another and said radiation guiding channel; and controlling a transverse intensity profile of each of said other radiation beams to steer formation of the plurality of radiation guiding channels.

4. The method of claim 1 further comprising modulation an intensity of the radiation beam to increase self-focusing so that a waist diameter of the radiation-guiding channels decreases.

5. The method of claim 1 further comprising modulation a shape of said radiation guiding channel along the path of said beam of wavelength, intensity, and wavefront of the radiation.

6. A method of patterning a polymer comprising:

exposing a photosensitive polymer to a radiation pattern along a selected path, the photosensitive polymer exhibiting a nonlinear optical response thereto such that an index of refraction of the photosensitive polymer along the selected path is changed;

controlling an intensity of the radiation pattern to change the index of refraction along the selected path so that self focusing occurs; and controlling a transverse intensity profile of said radiation pattern to steer the selected path.

7. A method according to claim 6, further comprising modulating a shape of said radiation pattern along the selected path by time-varying one of the wavelength, intensity or wavefront of the radiation.

8. A method comprising:

providing a reservoir of a liquid photopolymer exhibiting a nonlinear optical response upon application of a radiation beam thereto;

arranging a photolithographic mask adjacent to the reservoir;

applying the beam of radiation to the mask such that a light pattern is projected onto the liquid photopolymer to change an index of refraction due to the nonlinear optical response in a path of said light pattern in the liquid photopolymer to form a pattern of fibers corresponding to the light pattern; and controlling an intensity and an exposure time of the radiation beam to produce in the liquid photopolymer a self-focusing effect which reduces beam spreading caused by diffraction.

9. The method of claim 8 further comprising controlling a transverse intensity profile of said radiation beam to steer the path of the light pattern.

10. The method of claim 8 further comprising directing another radiation beam through another photolithographic mask such that another light pattern is projected onto the liquid photopolymer to form another pattern of fibers corresponding to the other light pattern.

11. The method of claim 8 wherein the light pattern comprises a disk such that the pattern of fibers is a single fiber.

12. The method of claim 8 wherein the light pattern comprises a donut such that the pattern of fibers is a hollow tube.

13. The method of claim 8 wherein the radiation beam is comprised of a collimated plane wave.

\* \* \* \* \*